(12) United States Patent
Lin et al.

(10) Patent No.: US 11,037,799 B2
(45) Date of Patent: Jun. 15, 2021

(54) METAL HETEROJUNCTION STRUCTURE WITH CAPPING METAL LAYER

(71) Applicant: Taiwan Semiconductor Manufacturing Co., Ltd., Hsinchu (TW)

(72) Inventors: Yi-Sheng Lin, Taichung (TW); Chi-Jen Liu, Taipei (TW); Kei-Wei Chen, Tainan (TW); Liang-Guang Chen, Hsinchu (TW); Te-Ming Kung, Taichung (TW); William Weilun Hong, Hsinchu (TW); Chi-Hsiang Shen, Tainan (TW); Chia-Wei Ho, Kaohsiung (TW); Chun-Wei Hsu, Hsinchu (TW); Yang-Chun Cheng, Hsinchu (TW)

(73) Assignee: Taiwan Semiconductor Manufacturing Co., Ltd, Hsinchu (TW)

( * ) Notice: Subject to any disclaimer, the term of this patent is extended or adjusted under 35 U.S.C. 154(b) by 0 days.

(21) Appl. No.: 16/400,620

(22) Filed: May 1, 2019

(65) Prior Publication Data
US 2020/0098591 A1 Mar. 26, 2020

Related U.S. Application Data

(60) Provisional application No. 62/736,957, filed on Sep. 26, 2018.

(51) Int. Cl.
*H01L 23/535* (2006.01)
*H01L 23/528* (2006.01)
(Continued)

(52) U.S. Cl.
CPC ...... *H01L 21/3212* (2013.01); *H01L 21/7684* (2013.01); *H01L 21/76805* (2013.01);
(Continued)

(58) Field of Classification Search
CPC ............. H01L 23/5226; H01L 23/5283; H01L 23/53209; H01L 23/53228;
(Continued)

(56) References Cited

U.S. PATENT DOCUMENTS

2006/0030143 A1* 2/2006 Ivanov .............. H01L 21/76864
438/622
2006/0121733 A1* 6/2006 Kilpela ............. H01L 21/32051
438/681

(Continued)

FOREIGN PATENT DOCUMENTS

JP 2013-110360 A 6/2013
JP 2014-137378 A 10/2014
(Continued)

*Primary Examiner* — Matthew E Warren
(74) *Attorney, Agent, or Firm* — Seed IP Law Group LLP

(57) ABSTRACT

The current disclosure describes techniques of protecting a metal interconnect structure from being damaged by subsequent chemical mechanical polishing processes used for forming other metal structures over the metal interconnect structure. The metal interconnect structure is receded to form a recess between the metal interconnect structure and the surrounding dielectric layer. A metal cap structure is formed within the recess. An upper portion of the dielectric layer is strained to include a tensile stress which expands the dielectric layer against the metal cap structure to reduce or eliminate a gap in the interface between the metal cap structure and the dielectric layer.

20 Claims, 18 Drawing Sheets

(51) Int. Cl.
*H01L 23/532* (2006.01)
*H01L 21/321* (2006.01)
*H01L 21/768* (2006.01)
*C09G 1/02* (2006.01)

(52) U.S. Cl.
CPC .. *H01L 21/76816* (2013.01); *H01L 21/76849* (2013.01); *H01L 21/76895* (2013.01); *H01L 23/5283* (2013.01); *H01L 23/535* (2013.01); *H01L 23/53209* (2013.01); *H01L 23/53228* (2013.01); *H01L 23/53257* (2013.01); *C09G 1/02* (2013.01)

(58) Field of Classification Search
CPC ... H01L 1123/5283; H01L 1123/53209; H01L 1123/53228; H01L 1123/1123; H01L 1123/53238; H01L 23/53257; H01L 23/535; H01L 23/53295
See application file for complete search history.

(56) References Cited

U.S. PATENT DOCUMENTS

| | | | |
|---|---|---|---|
| 2008/0054466 A1* | 3/2008 | Nasu | H01L 21/76886 257/751 |
| 2010/0270677 A1* | 10/2010 | Usami | H01L 21/76826 257/773 |
| 2014/0327140 A1* | 11/2014 | Zhang | H01L 23/53266 257/751 |
| 2019/0311992 A1* | 10/2019 | Bark | H01L 29/16 |
| 2020/0098623 A1* | 3/2020 | Cheng | H01L 23/53266 |

FOREIGN PATENT DOCUMENTS

| | | |
|---|---|---|
| KR | 10-2009-0085066 A | 8/2009 |
| KR | 10-2013-0056815 A | 5/2013 |

* cited by examiner

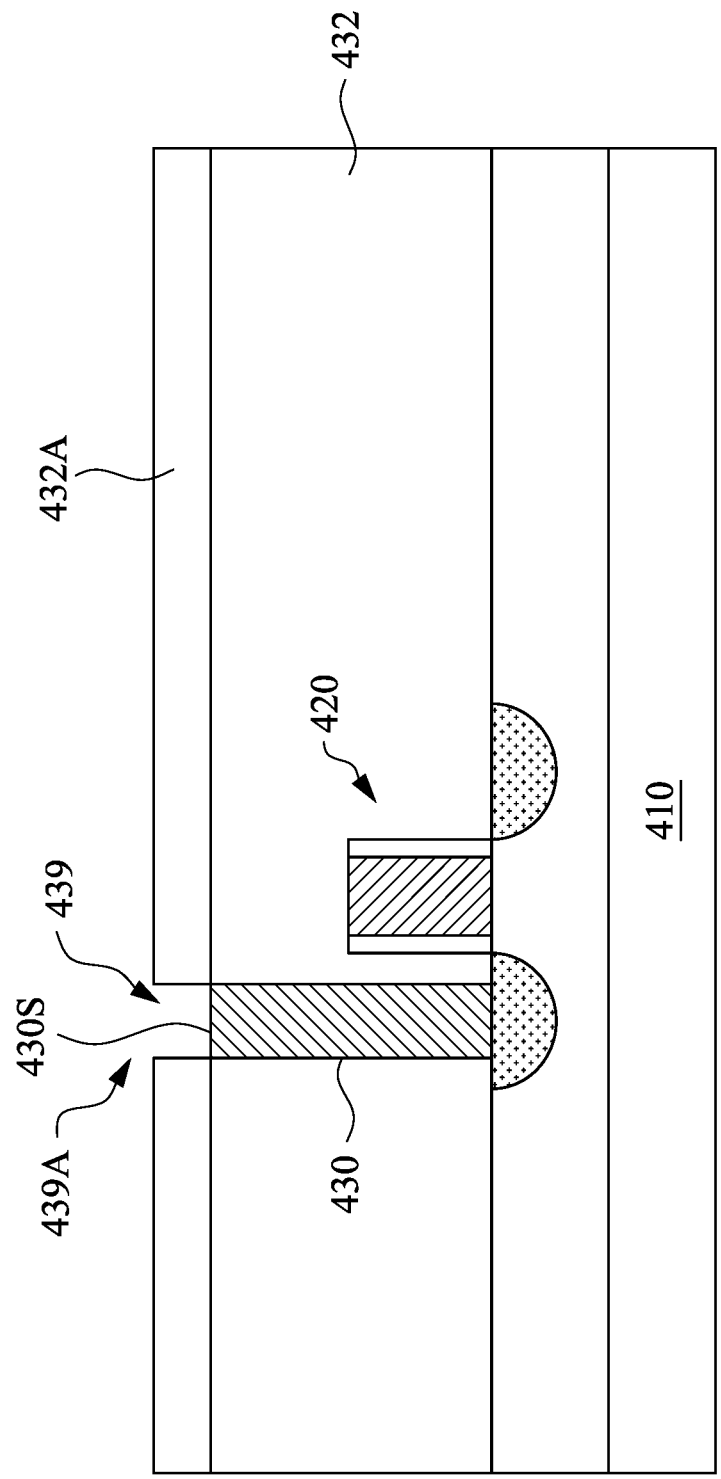
FIG. 4B(1)

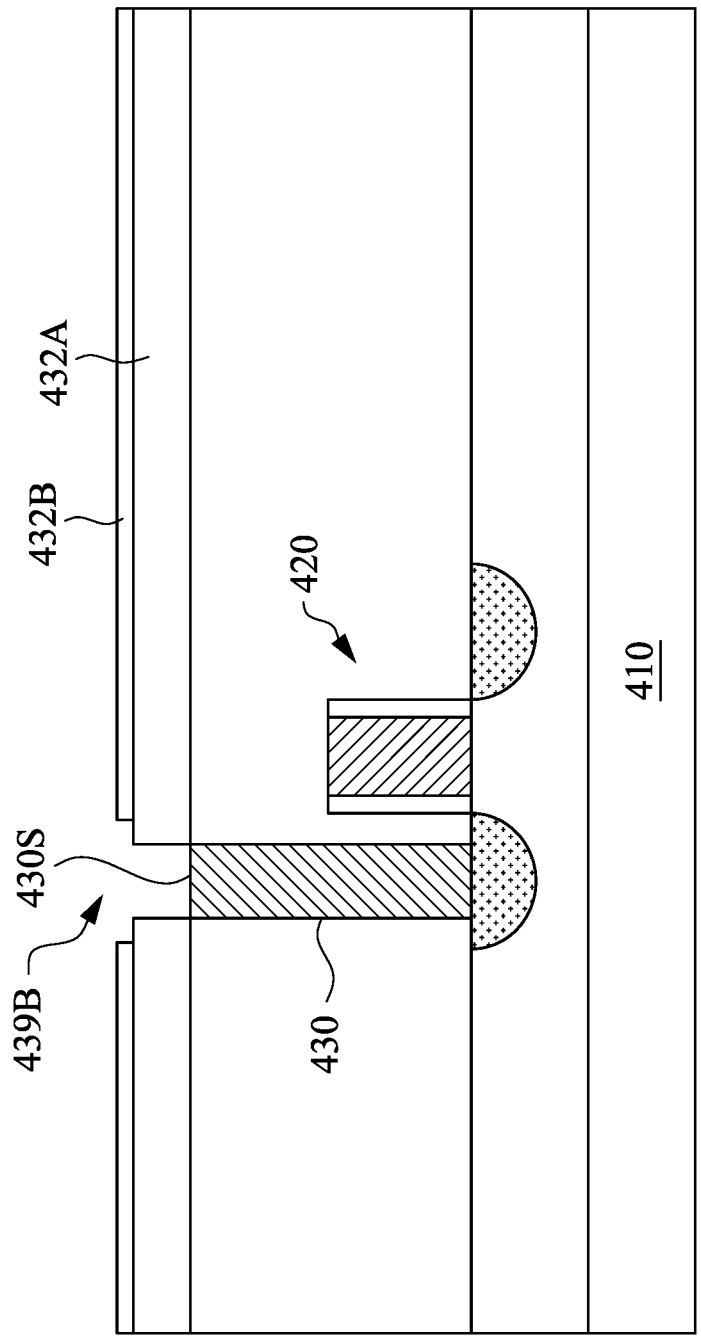
FIG. 4B(2)

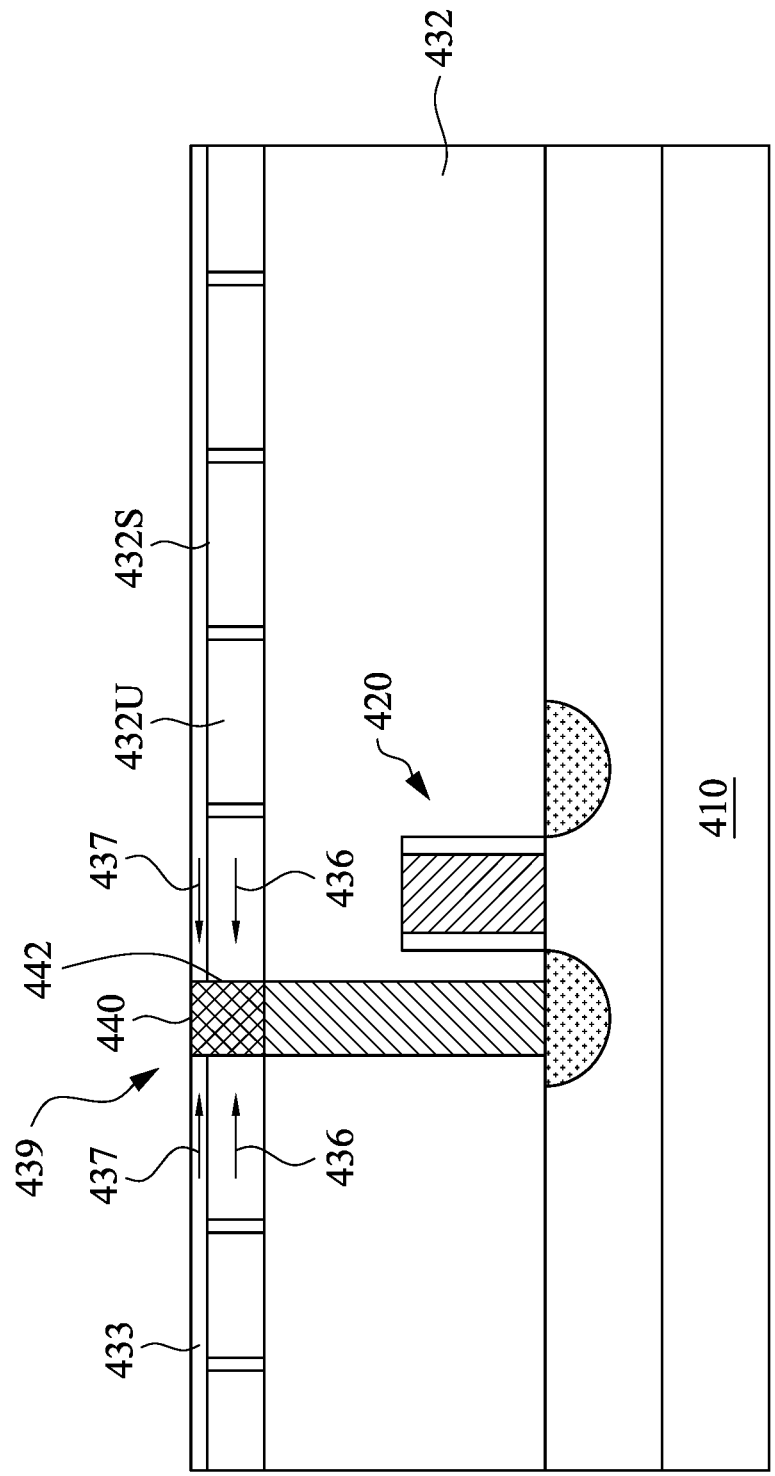
FIG. 4D(1)

METAL HETEROJUNCTION STRUCTURE WITH CAPPING METAL LAYER

BACKGROUND

Transistors are building blocks for integrated circuits. A transistor generally comprises a semiconductor substrate, a channel layer above or within the semiconductor substrate, a gate oxide layer and a gate stack above the channel layer, and source and drain diffusion regions on or in the surface of the semiconductor substrate. Electrical contacts are made to the gate stack, and to the source and drain diffusion regions of the transistor. On top of the transistors, a plurality of layers of metal lines, formed with copper, aluminum, tungsten or cobalt, on different planes, are routed for signal transmission among transistors. The planes where the metal lines reside are separated by inter-metal dielectric layers. Metal lines on different planes are connected through metal interconnect structures formed through the respective inter-metal dielectric layer. The metal interconnect structures may be generally formed with tungsten (W) or cobalt (Co).

In forming the metal interconnect structures, a chemical mechanical polishing (CMP) process is conducted to remove the excessive metal film on top of the inter-metal dielectric layer. The metal CMP process utilizes a CMP slurry that includes a mechanical abrasion component, an oxidizer(s) and/or an optional chemical metal etching component(s). The excessive metal film is oxidized by the oxidizer(s) so that the oxidized metal film can be removed by mechanical abrasion and/or chemical etching.

Various oxidizing metal salts, metal complexes and non-metallic oxidizing acids have been used as oxidizers in metal CMP slurries. Examples include periodic acids, nitrates, sulfates, citrates, potassium ferricyanide, potassium bromate, potassium iodate, hydrogen peroxide, ferric nitrate, calcium hypochlorite, and dichromate and other oxidizers.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
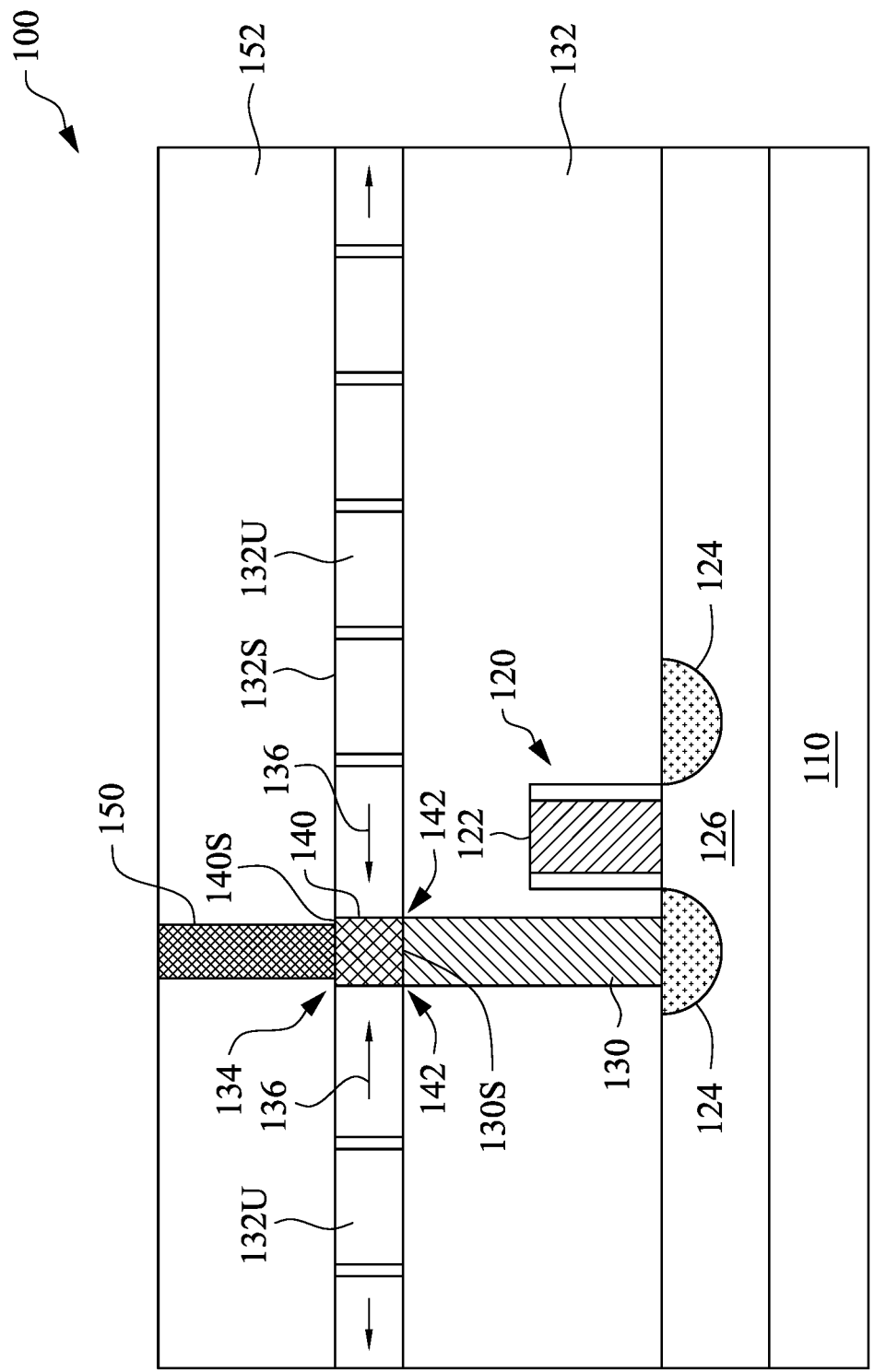
FIG. 1 shows an example semiconductor structure according to embodiments of the disclosure.

Various embodiments described herein are based on several observations. One observation is that in the back-end-of-line "BEOL" metallization design of semiconductor structures, the contact structures (e.g., the metal or conductive structures contacting the silicon layers), the local metal lines, the global metal lines, and the contact plugs (contact via) and/or other conductive connection structures are often made of different metal or metal compound materials. In the description herein, the term "metal interconnect structure" is used to refer to any such contact structures, metal lines, contact plugs, or other connection structures formed in the BEOL processes. In the semiconductor industry, the term "MOL" is sometimes used to refer to processes of gate contact and/or source/drain contact formation, although the term "BEOL" is generally used to refer to any wafer processes after the FEOL processes, i.e., the semiconductor fabrication processes. For descriptive purposes, in the description herein, the term "BEOL" is used to refer to any wafer processes after the FEOL processes, which includes the scenarios of the "MOL". Chemical mechanical polishing processes are used to polish and planarize those metal interconnect structures to remove excessive metal materials in the deposition of the metal interconnect structures, e.g., unwanted or undesired portions of the metal film used to form metal interconnect structures. In the CMP process of a first interconnect structure, the metal CMP slurry including the oxidizer contained in the CMP slurry may penetrate and travel through the interface between the first metal interconnect structure and the inter-metal dielectric layer around the first metal interconnect structure to reach a second interconnect structure that is underlying the first metal interconnect structure and is connected to the first metal interconnect structure. As a consequence, the underlying second metal interconnect structure may be oxidized, and may corrode or decay due to the direct contact with the oxidizer and the chemical solutions having an acidic (i.e., pH value<7) or alkaline property (i.e., pH value>7). Such oxidation, corrosion or decay cause connection failures and/or manufacturing yield loss. This issue becomes even more predominant with the technology nodes becoming smaller and approaching or reaching the sub-10 nm level. For example, in the sub-10 nm technologies, there may not be space allowance for a liner layer to be positioned between a metal interconnect structure and the surrounding inter-metal dielectric layer. The lack of liner layer generally means that the underlying second metal interconnect structures are more susceptible to the negative effects of oxidizer penetration because of the gap in the interface between the first metal interconnect structure and the surrounding dielectric layer.

Further, the underlying second interconnect structure may include a different metal material from the first interconnect structure, which makes it more difficult to protect both the first interconnect structure and the second interconnect structure in the scenario of oxidizer penetration. For example, a tungsten contact plug (via) structure may connect two layers of cobalt or copper metal lines. In another example, a cobalt interconnect structure may be formed between, and connect, two layers of tungsten or aluminum metal lines. Copper and cobalt more easily suffer from dissolution or other degradation issues in acidic CMP solutions that contain oxidizers. On the other hand, tungsten more easily suffers from dissolution or other degradation in alkaline CMP solutions that contain oxidizer. The different metals in the adjacent interconnect structures, and their different reactions to the CMP slurries make it difficult to protect the underlying metal interconnect structures from the CMP slurry used for polishing an upper metal interconnect structure.

Another observation is that in the CMP process to polish a metal interconnect structure together with an inter-metal dielectric layer surrounding the metal interconnect structure, the polish rates of the metal material and the dielectric material are different, which may result in a recess formed between the upper surface of the interconnect structure and the dielectric layer, i.e., the upper surface of the interconnect structure is lower than the surrounding dielectric layer. Such a recess will make it challenging to form a satisfactory connection between the interconnect structure and an upper interconnect structure. For example, the recess may be translated into a gap area in the connection interface between the underlying interconnect structure and the upper interconnection. The gap area makes the underlying interconnect structure more vulnerable to CMP chemicals from a CMP process polishing of the upper interconnect structure that penetrate to the gap area because the CMP chemicals will accumulate in the gap area where they can react with the underlying interconnect structure.

Various embodiments of the disclosed techniques form a metal cap structure to fill a recess area formed by an upper surface of a first interconnect structure and the surrounding dielectric layer. In forming the metal cap structure, measures are taken to protect the first interconnect structure from being damaged from contact with a CMP slurry used to polishing the layers formed over the first interconnect structure. In an embodiment, the metal cap structure is formed through a lift-off process such that there is no excessive metal material to be removed by a CMP process. As such, the first interconnect structure will not contact a CMP slurry and the first interconnect structure will not be damaged. Alternatively and/or additionally, an upper surface portion of the dielectric layer is strained, e.g., by ion implanting, such that tensile stress is introduced into the upper surface portion of the dielectric layer. More specifically, the volume of this expanded upper surface portion of the dielectric layer is increased. Increasing the volume of the upper surface portion of the dielectric has several benefits depending on the specific situation. For example, if a gap exists in the interface between the upper surface portion of the dielectric layer and the metal cap structure, increasing the volume of the upper surface portion will result in the upper surface portion expanding to make the gap smaller or close the gap. In another example, if little or no gap exists at the interface, increasing the volume of the upper surface portion will result in closing of the gap and the exertion of a compressive force by the upper surface portion of the dielectric layer on the metal cap structure. In still another example, where no gap exists in the interface, causing the upper surface portion to expand results in an increase in compressive force exerted by the upper surface portion of the dielectric layer on the metal cap structure. Each of the above results from the straining of the upper portion of the dielectric material which causes the upper portion to expand towards and in some instances compress against the the cap structure with an increased force, which will reduce the permeation of chemical solutions through the materials around the interface between the dielectric layer and the metal cap structure or penetration of chemical solutions through the interface to reach the first interconnect structure.

In an embodiment, the metal cap structure is a same metal material as a second upper interconnect structure or is a metal material that is a same type of metal material as the second interconnect structure with respect to the materials reacting to or with a CMP slurry used in polishing the second interconnect structure. As such, the metal cap structure will not be unduly damaged by the CMP slurry of the second interconnect structure should it come in contact with the CMP slurry or the reaction between the metal cap structure and the CMP slurry of the second interconnection structure is well controlled or compensated for in the process or device design. That is, the reaction between the cap structure and the CMP slurry of the second interconnect structure is similar to the reaction between the second interconnect structure and the CMP slurry. As such, the reaction between the cap structure and the CMP slurry of the second interconnect structure could be well controlled in the respective CMP process. The metal cap structure prevents the CMP slurry used to polish the second interconnect structure from reaching the underlying interconnect structure. Therefore, the underlying first interconnect structure will not be damaged by coming in contact with the CMP slurry used to planarize the upper second interconnect structure. Further, the metal cap structure also fills the unintentionally formed recess on the upper surface of the first interconnect structure, which helps to form a desirable electrical connection between the underlying first interconnect structure and the upper second interconnect structure.

In an embodiment, a semiconductor structure includes a semiconductor device formed over a substrate and a lower-level interconnect structure connected to one of the terminals of the semiconductor device, e.g., source, drain, gate, or body (ground) of a transistor. A metal cap structure is formed over the lower-level interconnect structure. An upper surface of the metal cap structure is substantially at a same level as a lower-level inter-metal dielectric layer that surrounds the lower-level interconnect structure. An upper portion of the lower-level inter-metal dielectric layer is doped to strain this upper portion such that the upper portion has a tensile stress that applies a force against an interface between the lower-level inter-metal dielectric layer. Specifically, for example, the volume of the upper portion is increased and in some embodiments a compressive force exerted by this upper portion of the lower-level inter-metal dielectric on the metal cap structure, i.e., in a direction toward the metal cap structure is increased. An upper-level interconnect structure is formed over the metal cap structure and is surrounded by an upper-level inter-metal dielectric layer. In an embodiment, the metal cap structure includes a same metal material or a same type of metal materials as the up-level interconnect structure. In an embodiment, the metal cap structure includes a different metal material from the lower-level interconnect structure.

The disclosure herein provides many different embodiments, or examples, for implementing different features of the described subject matter. Specific examples of components and arrangements are described below to simplify the present description. These are, of course, merely examples, and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows an example structure 100. Referring to FIG. 1, the structure 100 includes a substrate 110, e.g., a silicon substrate, and a device 120 formed over the substrate. The device 120 is illustratively shown as a transistor device having a gate 122, a source/drain region 124 and a body 126. A first interconnect structure 130 that contacts one of the gate 122, source/drain 124 or the body 126 (e.g., through the substrate 110) is formed within a first dielectric layer 132. An upper surface 130S of the first interconnect structure 130 is lower than an upper surface 132S of the first dielectric layer 132. A recess 134 is formed between the upper surface 130S of the first interconnect structure 130 and the upper surface 132S of the first dielectric layer 132. Specifically, the recess 134 is positioned within the first dielectric layer 132 and over the upper surface 130S of the first interconnect structure 130.

A metal cap layer 140 is formed within the recess 134 and covers the upper surface 130S of the first interconnect structure 130 that is exposed from the recess 134. In an embodiment, the metal cap structure 140 has a different metal or metal compound material from that of the first interconnect structure 130. An upper portion 132U of the dielectric layer 132 is strained, e.g., by being doped, to have a tensile stress. The tensile stress causes the upper portion 132U of dielectric layer 132 to expand and increase in volume in a direction of cap structure 140 and in some embodiments increase a compressive force upper portion 132U exerts against metal cap layer 140 when strained upper portion 132U of dielectric layer 132 contacts cap structure 140, as illustrated with arrows 136. The increased volume of upper portion 132U cause the dielectric material of the upper portion 132U to expand towards the metal cap structure 140 such that a gap, if any, at the interface 142 between the first dielectric layer 132, specifically the upper portion 132U, and the metal cap structure 140 is reduced in size or eliminated. In accordance with embodiments where the gap is small, i.e., of a dimension that is less than the amount upper portion 132U expands after being doped, the expansion of upper portion 132U results in the gap being closed and a compressive force being exerted by upper portion 132U on metal cap structure 140. In accordance with other embodiments where a gap does not exist, expansion of upper portion 132U results in increased compressive forces 136 being exerted by the dielectric material of the upper portion 132U on the metal cap structure 140. Closing of the gap and/or the increased compressive force exerted by the dielectric material of the upper portion 132U on the metal cap structure 140 reduces the risk that materials detrimental to the underlying first interconnect structure, e.g., a CMP solution used to planarize an upper second interconnect structure, will reach the underlying first interconnect structure.

A second interconnect structure 150 is formed over the cap structure 140 and contacts the cap structure 140. In an embodiment, the second interconnect structure 150 has a same conductive material as the cap structure 140. In another embodiment, a material of the second interconnect structure 150 is a same type of metal or metal compound material as the cap structure 140 such that the cap structure 140 and the second interconnect structure 150 react similarly to a CMP chemical solution they contact. For example, copper and cobalt are a same type of metal material in that the two materials both suffer from dissolution or other degradation issues in acidic CMP solutions and are both resistive to dissolution or other degradation by alkaline CMP solutions. On the other hand, cobalt and tungsten are different types of metal materials because tungsten suffers from dissolution or other degradation issues in alkaline CMP solutions and is resistive to dissolution or other degradation by acidic CMP solutions. Embodiments of the present disclosure are not limited to copper, cobalt and tungsten and in other embodiments the metal materials are metal materials other than copper, cobalt and tungsten. In an illustrative example, the first interconnect structure 130 is cobalt, and the cap structure 140 and the second interconnect structure 150 are tungsten.

The device 120 is illustratively shown as a field effect transistor, which does not limit the scope of the disclosure. Other devices, like bipolar devices or tunnel field effect transistors, are also possible and included in the disclosure. The first interconnect structure 130 is illustratively shown as a contact structure to the device, specifically to the source/drain region 124, which is not limiting. The first interconnect structure may be any metal interconnect structures that are positioned below another metal interconnect structure.

In an embodiment, as shown in FIG. 1, the metal cap structure 140 substantially aligns with the upper surface 130S of the first interconnect structure 130. Further, an upper surface 140S of the cap structure 140 is substantially at a same level as the upper surface 132S of the dielectric layer 132. However, the disclosure is not limited by this example profile of the cap structure 140 relative to the upper surface 130S of the first interconnect structure 130 or the upper surface 132S of the dielectric layer 132.

FIGS. 2A to 2D show alternative embodiments of the cap structure 140. The alternative embodiments each include some similar structural features as the structure 100 of FIG. 1, the descriptions of which are omitted for simplicity purposes. In the alternative embodiment shown in FIG. 2A, the cap structure 240(A) fully covers the first interconnect structure 130 and also laterally extends, at least in some directions, beyond the surface 130S of the first interconnect structure 130 and covers a portion of dielectric layer 132 around cap structure 240(A). That is, the cap structure 240(A) extends laterally beyond the first interconnect structure 130 at least in one direction.

Figure 2A:
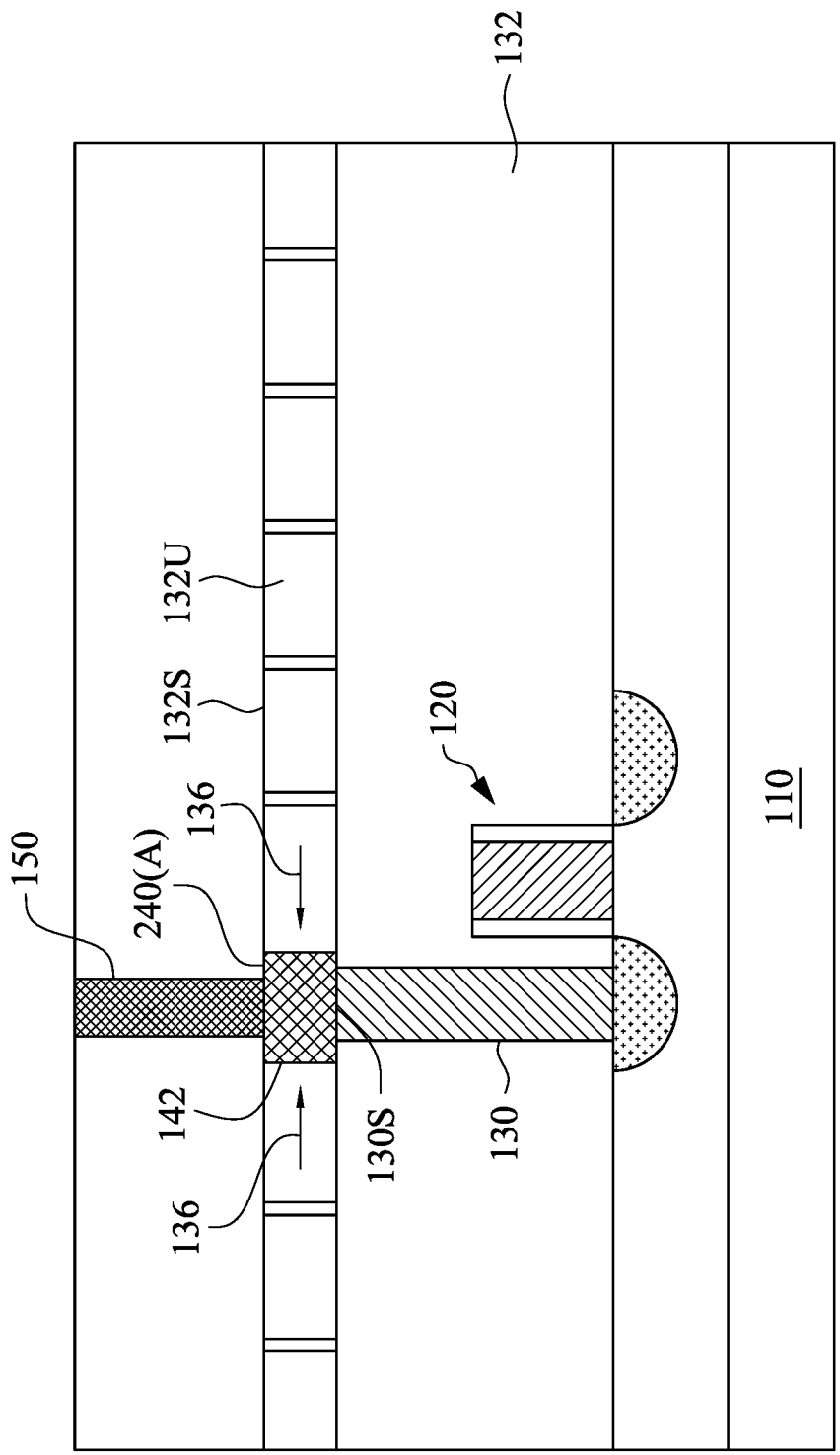
FIGS. 2A-2D show alternative embodiments to the semiconductor structure of FIG. 1.
Figure 2B:
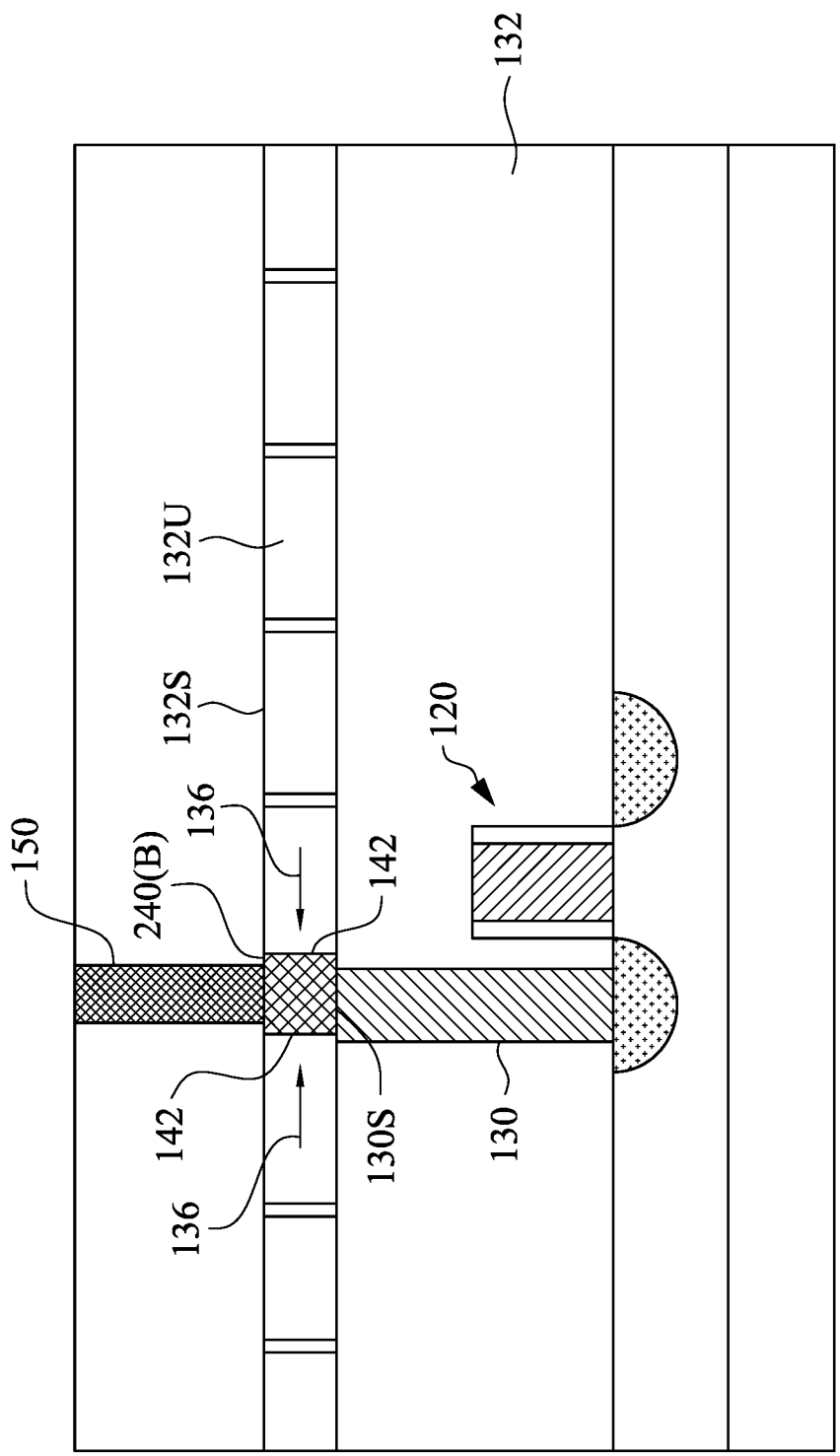

In the alternative embodiment shown in FIG. 2B, the cap structure 240(B) misaligns with and partially overlaps the first interconnect structure 130, but does not fully overlap the first interconnect structure 130. The cap structure 240(B) is still positioned between the first interconnect structure 130 and the second interconnect structure 150 such that a CMP chemical solution used for polishing the second interconnect structure 150 will not reach the first interconnect structure 130 below the cap structure 140. The expansion of upper portion 132U of dielectric layer 132 results in closing of the gap at the interface between the dielectric layer 132 and cap structure 240(B) and/or increased compressive forces 136 exerted by the upper portion 132S of the first dielectric layer 132 at the interface 142 between the first dielectric layer 132, or specifically the upper portion 132U of the first dielectric layer 132, and the metal cap structure 240(B). This closing of the gap and/or increased compressive force in the interface 142 is such that chemical solution used in the CMP process of the second interconnect structure 150 cannot permeate or penetrate through the interface 142 to reach the underlying first interconnect structure 130. The first dielectric layer 132 is silicon oxide or another low-k dielectric material, e.g., dielectric constant lower than 4.

In an embodiment, the upper portion 132U of the first dielectric layer 132 is a separate layer from the rest of the first dielectgric layer 132. For example the upper layer 132U is silicon nitride and the rest of the first dielectric layer 132 is silicon oxynitride SiOxNy or other low-k dielectric materials. The thickess of the upper portion 132U of silicon nitride is relatively small, e.g., between about 15 Å to about 25 Å such that the overall dielectric constant value of the combination of the first dielectric layer 132 including the upper silicon nitride portion 132U and the silicon oxynitride of the rest of the layer 132 is still relatively low.

The tensile stress within the upper portion 132U may be enhanced by forming the upper portion 132U, e.g., of silicon nitride, with multiple layers in a plurality of successive deposition and/or treatment cycles. The residual tensile stress may also be incorporated by depositing the silicon nitride 132U with a lower temperature, e.g., about 400° C. to 450° C., prior to subsequent radiation curing. The tensile stress within the upper portion 132U may also be enhanced by incorporation of various dopants, e.g., Zr or Mg dopants or other suitable dopants. For a silicon oxide upper portion 132U, the tensile stress may be enhanced with incorporation of dopants like one or more of germanium "Ge," silicon "Si," carbon "C," nitrogen "N," phosphorus "P," or boron "B."

Figure 2C:
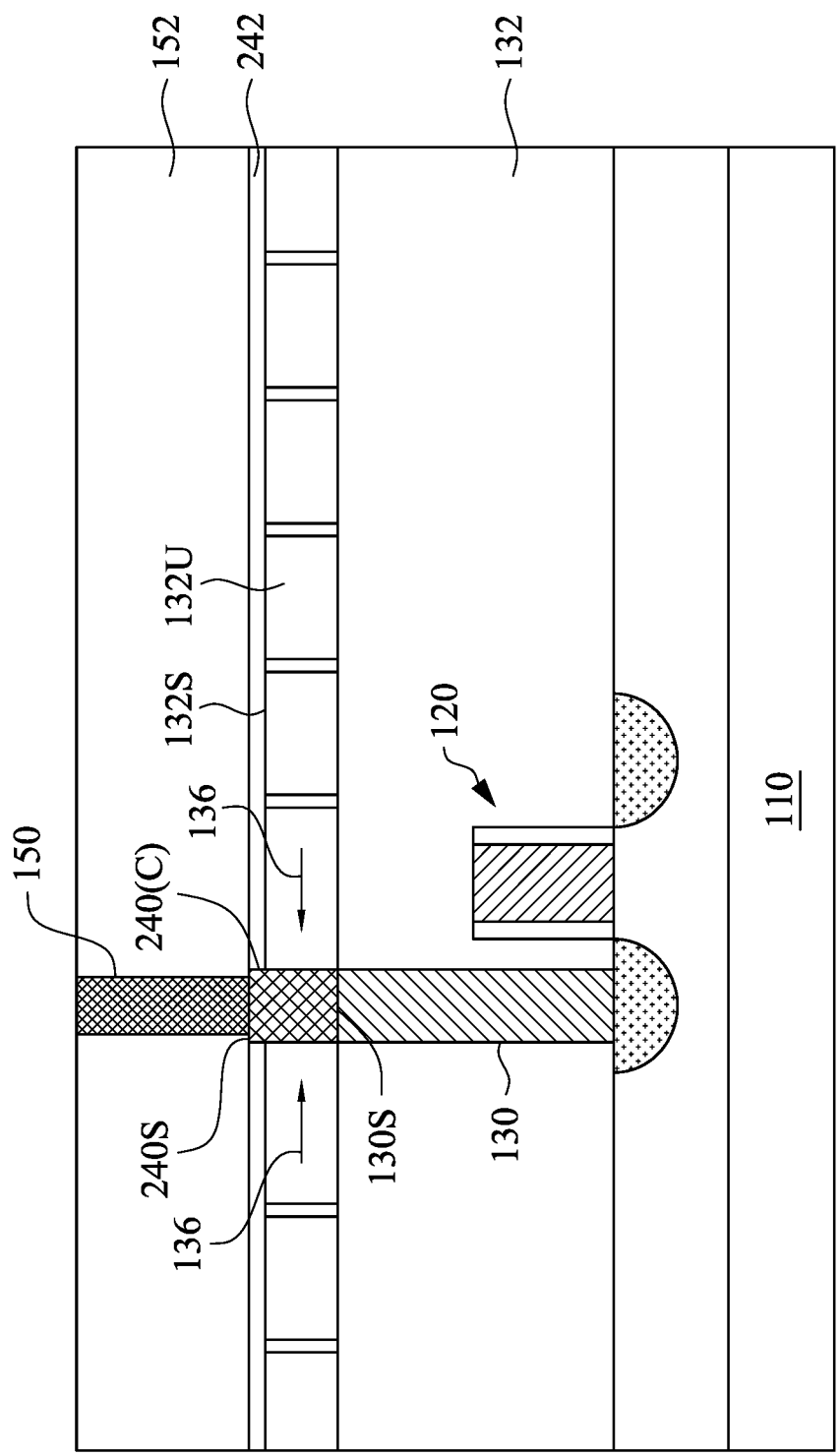

In the alternative embodiment shown in FIG. 2C, the cap structure 240(C) extends upward beyond the first dielectric layer 132. Specifically, an upper surface 240S of the cap structure 240(C) is higher than the upper surface 132S of the first dielectric layer 132. In an embodiment, a third dielectric layer 242 is positioned between the first dielectric layer 132 and the second dielectric layer 152. The third dielectric layer 242 may include a same dielectric material as one or more of the first dielectric layer 132 or the second dielectric layer 152, or may include a different dielectric material from either of them. In an embodiment, the third dielectric layer 242 may be strained by one or more of being formed with a residual tensile stress or being doped with an impurity to enhance tensile stress. The tensile stress within the third dielectric layer 242 causes third dielectric layer 242 to expand in a direction of cap structure 240(C) and close a gap at the interface between third dielectric layer 242 and cap structure 240(C) and/or increase a compressive force exerted by third dielectric layer 242 on cap structure 240(C) when modified third dielectric layer 242 contacts cap structure 240(C).

For example, the third dielectric layer 242 is silicon nitride. The tensile stress within the silicon nitride layer 242 may be enhanced by forming the layer 242 nitride material with multiple layers in a plurality of successive deposition and/or treatment cycles. The residual tensile stress may also be incorporated by depositing the silicon nitride layer 242 with a lower temperature, e.g., about 400° C. to 450° C., prior to subsequent radiation curing. The tensile stress within the silicon nitride layer 242 may also be enhanced by incorporation of various dopants, e.g., Zr or Mg dopants or other suitable dopants. For a silicon oxide layer 242, the tensile stress may be enhanced with incorporation of dopants like one or more of germanium "Ge," silicon "Si," carbon "C," nitrogen "N," phosphorus "P," or boron "B."

In another embodiment, the third dielectric layer 242 is not modified, e.g., by being doped, and therefore does not exhibit the expansion of upper portion 132U of the first dielectric layer 132 which has been modified, e.g., by being doped. For example, the third dielectric layer 242 may function, among others, as an etch stop layer.

Figure 2D:
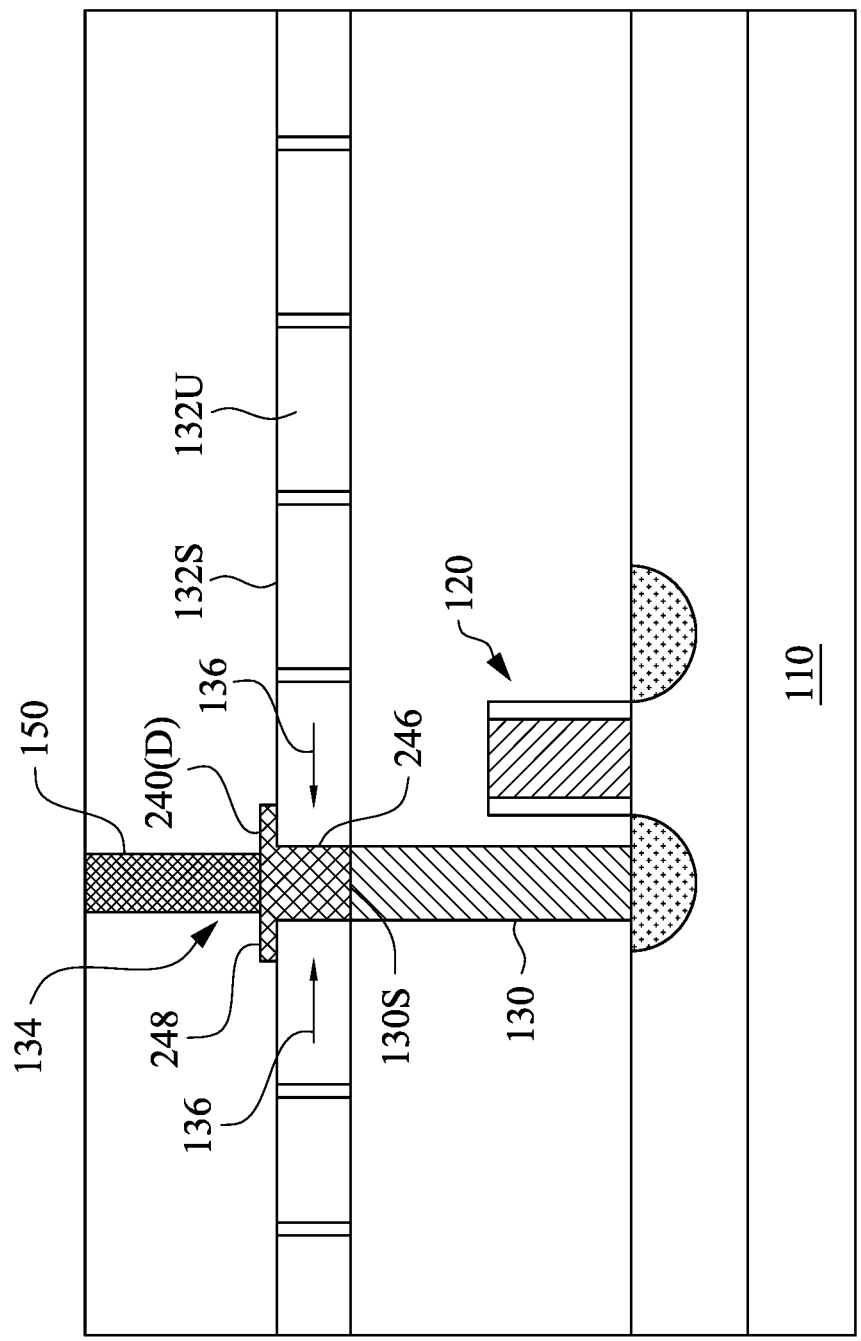

In the alternative embodiment shown in FIG. 2D, the cap structure 240(D) includes a first portion (or a lower portion) 246 and a second portion (or a higher portion) 248. The lower portion 246 is enclosed within the recess 134 and the higher portion 248 extends upward beyond the upper surface 132S of the first dielectric layer 132 and extends laterally beyond, at least in some direction, the recess 134. For example, the higher portion 248 may be formed by patterning the excessive metal materials deposited over the first dielectric layer 132 in a damascene process. The higher portion 248 and the lower portion 246 may also be formed together through a dual damascene process.

The substrate 110 may include a silicon substrate in crystalline structure and/or other elementary semiconductors like germanium. Alternatively or additionally, the substrate 110 may include a compound semiconductor such as silicon carbide, gallium arsenide, indium arsenide, and/or indium phosphide. Further, the substrate 110 may also include a silicon-on-insulator (SOI) structure. The substrate 110 may include an epitaxial layer and/or may be strained for performance enhancement. The substrate 110 may also include various doping configurations depending on design requirements as is known in the art, such as P-type substrate and/or N-type substrate and various doped regions such as P-wells and/or N-wells.

Figure 3:
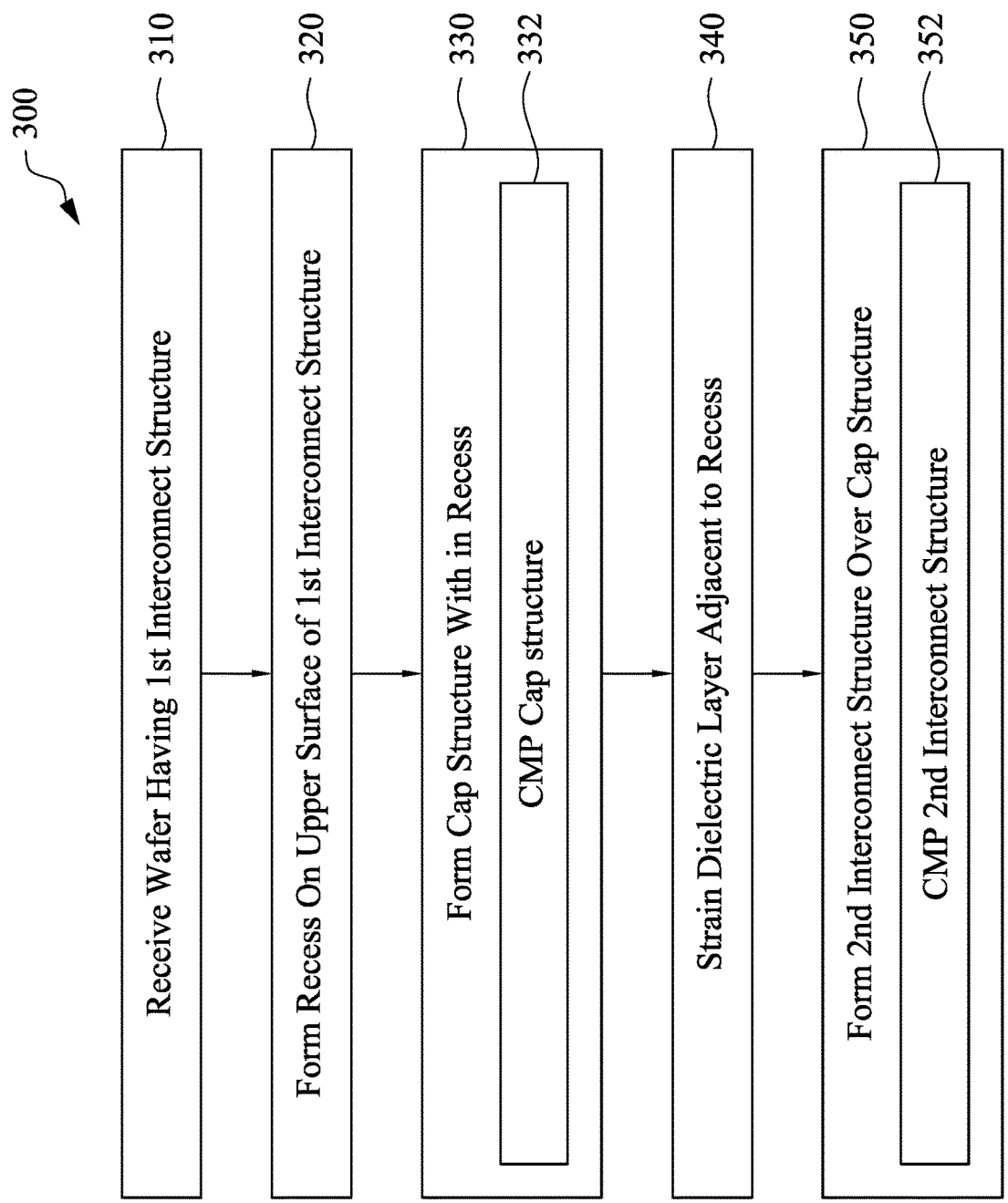
FIG. 3 shows an example fabrication process according to embodiments of the disclosure.

FIG. 3 shows a flow diagram of an example fabrication process 300, which may be used to make one or more of the structure embodiments of FIGS. 1 and 2 or other semiconductor structures. FIGS. 4A to 4G show a wafer 400 in various stages of a fabrication process in making the structure 100 of FIG. 1, as an example.

Figure 4A:
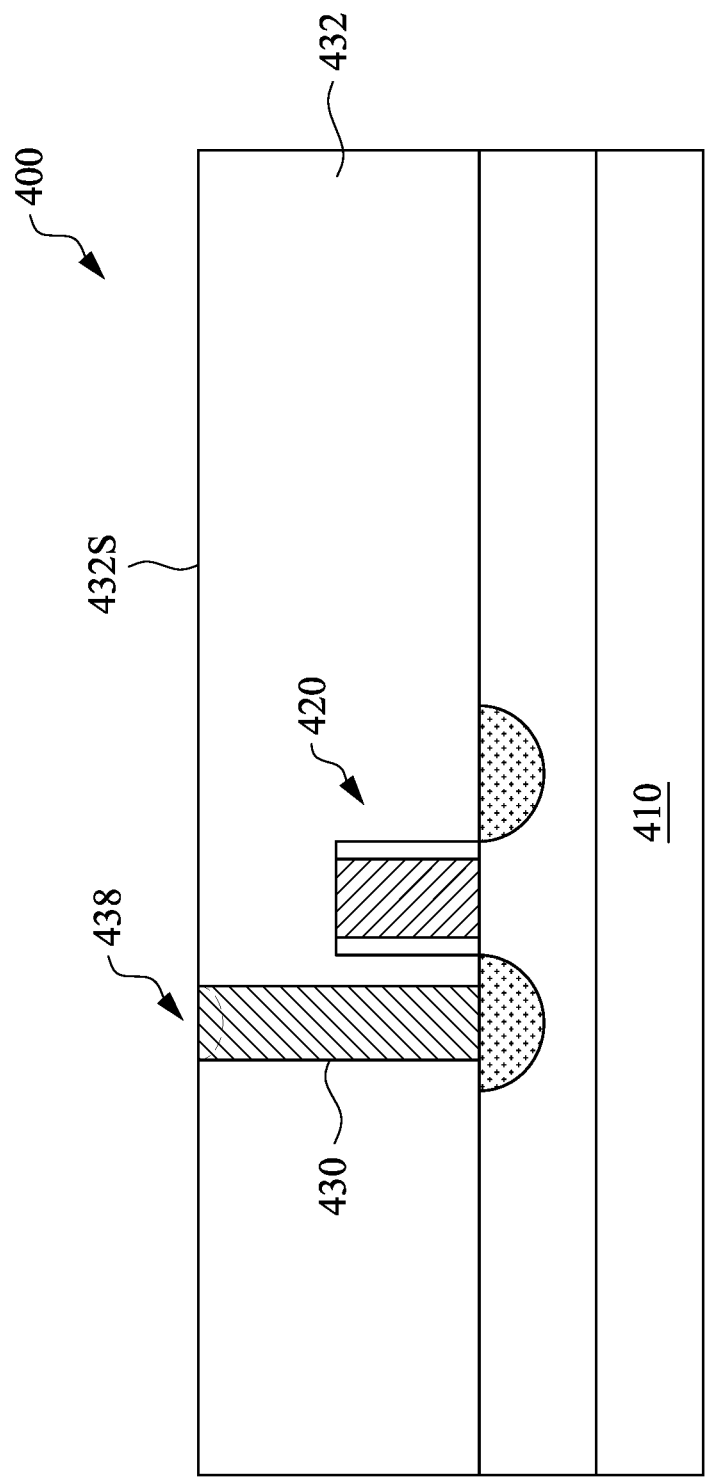
FIGS. 4A-4G show, in cross-sectional views, an example wafer in various stages of the fabrication process of FIG. 3.

Referring to FIG. 3, with reference also to FIG. 4A, in example operation 310, a wafer 400 is provided. The wafer 400 includes a substrate 410, e.g., a silicon substrate, and a device 420 formed over the substrate 410. An interconnect structure 430 is formed within a dielectric layer 432 and contacts, directly or indirectly, a terminal of the device 420, e.g., a body, a source electrode, a drain electrode, or a gate electrode of the device 420. FIG. 4A shows as an illustrative example that the interconnect structure 430 is a contact structure directly contacting a source/drain region of the device 420, which does not limit the scope of the disclosure.

In the embodiment illustrated in FIG. 4A, a CMP process on the wafer 400 has been completed. A CMP process normally is an integrated component of a damascene process of forming a contact plug or a connection via. As the CMP process polishes the metal material of the interconnect structure 430 and dielectric material of the first dielectric layer 432 with different polish rates, the upper surface of the interconnect structure 430 may not be perfectly planar, e.g., at the same height, with the upper surface 432S of the first dielectric layer 432. In an embodiment, the upper surface of the interconnect structure 430 includes an unintentionally formed recess portion 438, as shown in dotted line. The recess portion 438 refers to the surface of the interconnect structure 430 being lower than the surface 432S of the first dielectric layer 432. In another embodiment, the upper surface of the interconnect structure 430 is unintentionally formed higher than the upper surface 432S of the first dielectric layer 432.

The first interconnect structure 430 is formed of a first conductive material, e.g., cobalt "Co," of a first type with respect to its reaction to the pH characteristic of a CMP slurry. For example, cobalt is more sensitive or vulnerable to attack by acidic CMP solutions containing oxidizers.

Figure 4B:
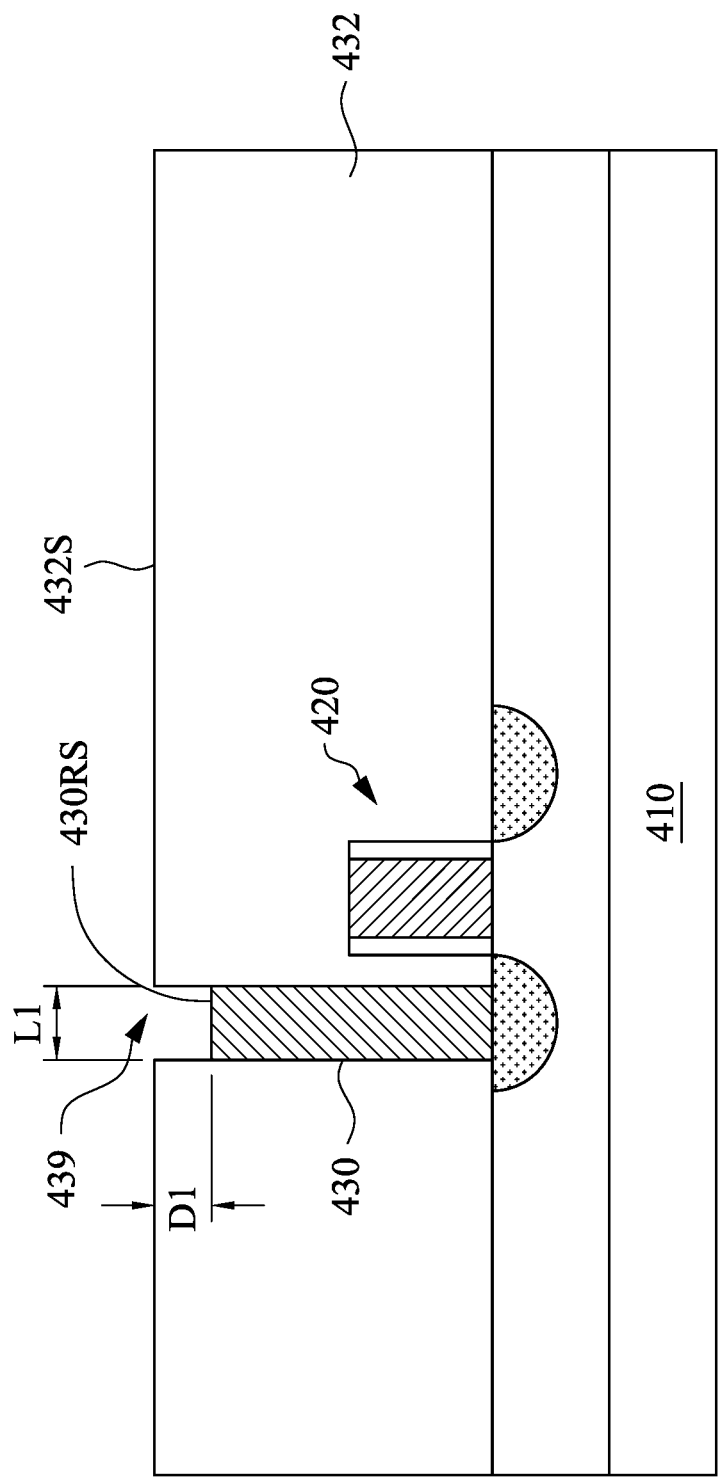

In example operation 320, with reference also to FIG. 4B, a recess 439 is formed by receding the upper surface of the first interconnect structure 430. The recess 439 is formed between a receded surface 430RS of the interconnect structure 430 and the dielectric layer 432. In an embodiment, the receding of the first interconnect structure 430 is implemented by etching. Suitable etching processes include dry etching or selective wet etching. A dry etching process removes a material through a bombardment of ions, usually a plasma of reactive gases such as fluorocarbons, oxygen, chlorine, etc., which dislodges portions of the material from an exposed surface. A patterned photoresist layer may be used in a dry etching to improve the accuracy of the removal of the material. A wet etching selective to the material of the exposed portion of the metal interconnect structure 430 removes a portion of the exposed interconnect structure 430, with the dielectric layer 432 remaining substantially intact. Embodiments of the present disclosure are not limited to the foregoing etching processes for receding first interconnect structure 430. Processes other than wet etching or dry etching may be used in to recede first interconnect structure 430 in accordance with disclosed embodiments In an embodiment, the formation of recess 439 is controlled such that a ratio between a depth D1 and a diameter L1 of the recess 439 is relatively small, e.g., smaller than 1.5. In some embodiments, the ratio between D1 and L1 is smaller than 1. This low depth versus diameter ratio results in a structure formed within the recess 439 having a low aspect ratio, which enables the use of some metal deposition routines that are more suitable for low aspect ratio structures. For example, physical vapor deposition (PVD), chemical vapor deposition (CVD), atomic layer deposition (ALD) or the like are more suitable for forming low aspect ratio structures than high aspect ratio structures. The PVD, CVD, ALD deposition processes all have good gap-fill characteristics, which can be advantageously used in forming the cap structure 140 of FIG. 1 as discussed herein. In an embodiment, the diameter L1 is within a range between about 2 nm to about 5 nm and the depth D1 is within a range between about 2 nm to about 4 nm. Embodiments of the present disclosure are not limited to the foregoing aspect ratios, L1 and D1. In accordance with other embodiments of the present disclosure the aspect ratio, L1 and D1 may different than the values and ranges expressly described above.

FIG. 4B shows one example embodiment of intentionally forming the recess 439 in-situ, which does not limit the scope of the disclosure. The recess 439 may also be formed through other processes, which are all included in the disclosure. For example, as shown in FIG. 4B(1), an additional dielectric layer 432A is formed over the dielectric layer 432, and is patterned to form an aperture 439A exposing the first interconnect structure 430. The aperture 439A and the upper surface 430S of the interconnect structure 430 form the recess 439.

In a further embodiment, the example operation 320 is not conducted and the recess 439 is not intentionally formed. The recess 438, as a naturally or unintentionally formed recess portion between the upper surface of the first interconnect structure 430 and the first dielectric layer 432, is used in subsequent fabrication processes without further modification. As such, subsequent references to the recess 439 may refer to either the unintentionally formed recess 438 or the intentionally formed recess 439.

In a further embodiment, as shown in FIG. 4B(2), a dual damascene process is used to form a staggered aperture 439B through two additional dielectric layers 432A, 432B. The staggered aperture 439B is suitable for forming the example cap structure of FIG. 2D. Note that there may be etch stop layers between the adjacent dielectric layers 432, 432A, 432B to facilitate the formation of the apertures 439A, 439B, which are omitted for simplicity purposes.

Figure 4C:
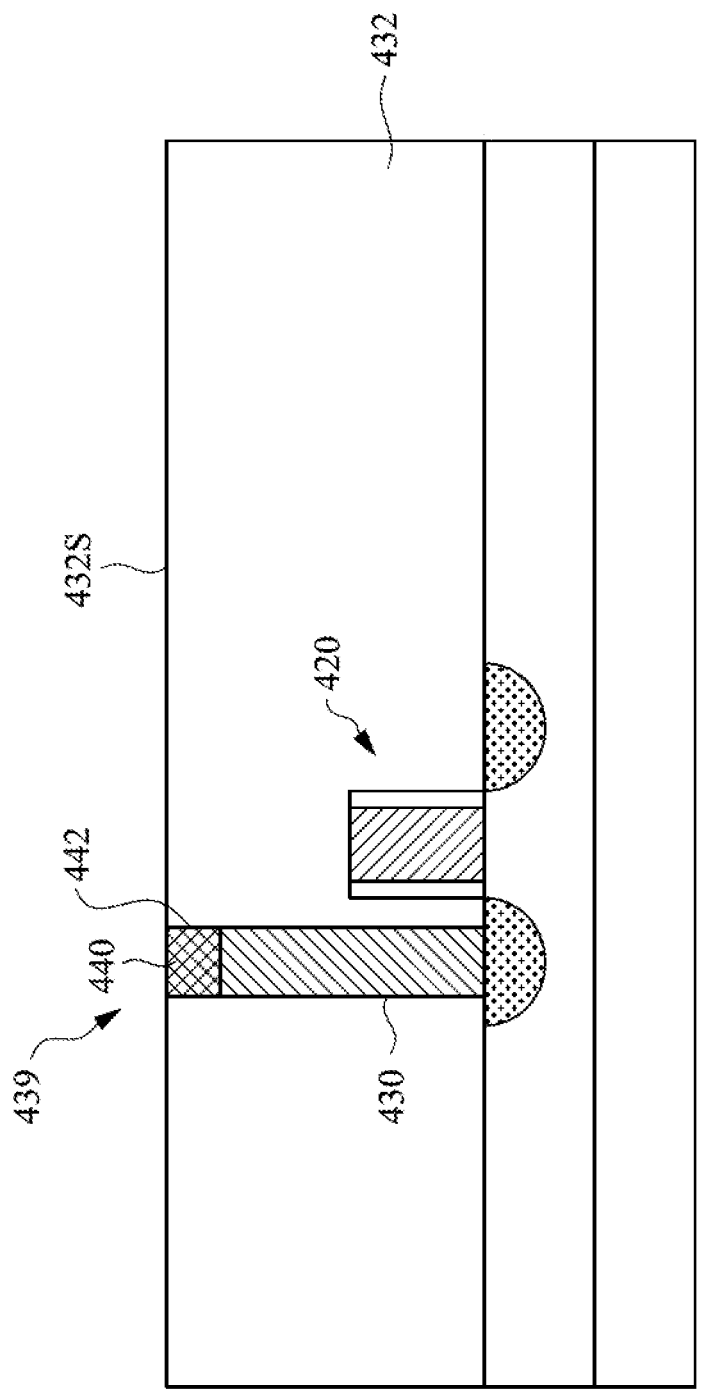

In example operation 330, with reference also to FIG. 4C, a cap structure 440 is formed within the recess 439. In an embodiment, the cap structure 440 is a conductive material different from the conductive material of the first interconnect structure 430. In an example, the material of the cap structure 440 is a different type (second type) of conductive material with respect to its reaction to the pH characteristic of a metal CMP slurry. For example, tungsten "W" is more sensitive or vulnerable to alkaline CMP solutions containing oxidizers, which is different that the sensitivity of cobalt or copper to alkaline CMP solutions. Aluminum is similar to tungsten with respect to its reaction to the pH characteristics of a metal CMP slurry. In an embodiment, the cap structure 440 is tungsten.

The cap structure 440 is formed under one of the damascene process or the lift-off process. Depending on the specific formation process, a CMP operation 332 may be included in the operation 330 in the formation of the cap structure 440. For example, if a damascene process is used, a CMP process 332 is normally included to remove the excessive metal material deposited over the surface 432S of the dielectric layer 432. In a case that the lift-off process is used and well controlled, a CMP process is optional. The deposition of the conductive material of the cap structure 440, e.g., tungsten, is conducted via one of CVD, PVD or ALD or other processes that have a good gap-filling property. The good gap-filling properties of the CVD, PVD, or ALD processes ensure that an interface 442 between the cap structure 440 and the dielectric layer 432 is substantially void-free, such that the CMP slurry for polishing the cap structure 440 or for polishing another interconnect structure over the cap structure 440 will not permeate or penetrate through the interface 442 to reach the first interconnect structure 430.

In a further embodiment, the cap structure 440 is not formed within an intentionally formed recess 439. Instead, the cap structure 440 is formed within the unintentionally formed recess 438 on the upper surface of the first interconnect structure 430 (FIG. 4A).

Figure 4D:
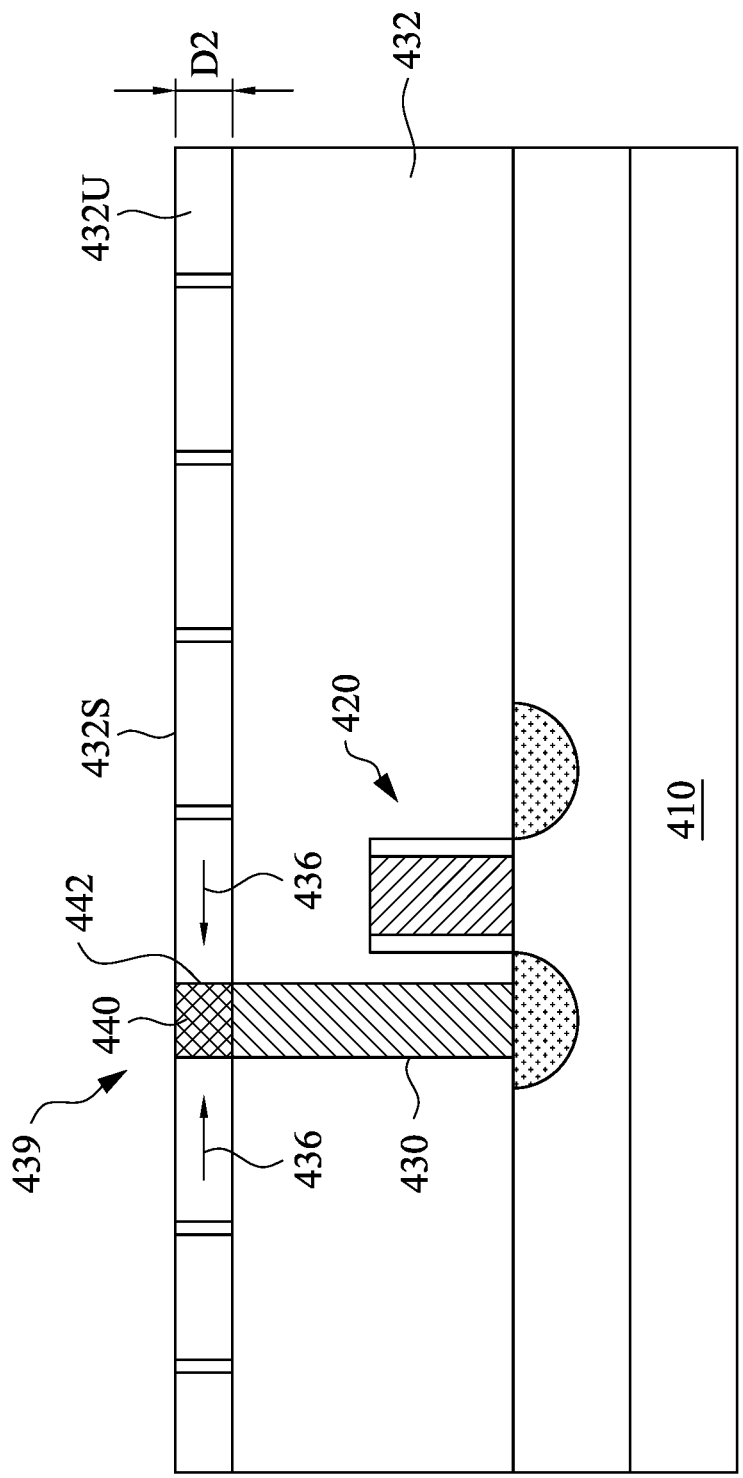

In example operation 340, with reference also to FIG. 4D, an upper portion 432U of the dielectric layer 432 is strained, e.g., by being doped, so as to cause upper portion 432 to expand in a lateral direction. This straining is implemented through ion implant of one or more of dopants germanium "Ge," silicon "Si," carbon "C," nitrogen "N," phosphorus "P," or boron "B." Such modification of upper portion 432U causes upper portion 432U of dielectric layer 432 to expand towards (see arrows 436) the interface 442 between the dielectric layer 432 and the cap structure 440 such that a gap in the interface 442, if any, between the dielectric layer 432 and the cap structure 440 is reduced or minimized. In embodiments where there is no gap in the interface 442 between dielectric layer 432 and cap structure 440, such expansion of upper portion 432U results in an increase in the compressive force exerted by upper portion 432U on cap structure 440. The compressive force exerted by upper portion 432U on cap structure 440 as a result of expansion of upper portion 432U also occurs when the amount of expansion of upper portion 432U resulting from the doping is larger than the size of the gap in interface 442. The ion implant of the dopants is controlled to be shallow, such that the modification of the expansion property of upper portion 432U of dielectric layer 432 is sufficient to remove any gap at interface 442 between upper portion 432U and metal cap structure 440 and/or increase the compressive force exerted by upper portion 432U on metal cap structure 440 when the two contact each other. Therefore, the depth of the ion implant or the depth of the upper portion 432U is equal to or slightly larger than the depth D1 of the recess 439 in which the cap structure 440 rests.

The modification process of the example operation 340 may be conducted before the cap structure 440 formation or after the cap structure 440 formation. In an embodiment, if a CMP process is included in the formation of the cap structure 440, the upper portion 432U is modified before the cap structure 440 formation, such that the interface 442 gap is reduced to prevent the CMP slurry from penetrating to the first interconnect structure 430 during the polishing of the excessive metal material of the cap structure 440.

As described herein, the upper portion 432U may also be a separate layer or a plurality of separate layers from the rest of the dielectric layer 432. The separate upper portion 432U may be formed directly with a suitable stress (residual stress), e.g., suitable tensile stress, without further modification.

In another embodiment, the whole dielectric layer 432 may be formed with a suitable tensile stress such that the dielectric material tends to expand to eliminate a gap, if any, between the cap structure 440 and/or the first interconnect structure 430 and the surrounding dielectric material of the dielectric layer 432.

FIG. 4D(1) shows an alternative or additional embodiment. As shown in FIG. 4D(1), an etch stop layer 433, e.g., of silicon nitride, is formed over the dielectric layer 432. The cap structure 440 is formed also within the etch stop layer 433. The etch stop layer 433 may also be formed with appropriate tensile stress or modified to incorporate tensile stress. The tensile stress within the etch stop layer 433 renders a compressive force 437 against the sidewall of the cap structure 440 to eliminate or reduce a gap, if any, between the the sidewall of the cap structure 440 and the surrounding etch stop layer 433.

In some embodiments, one of the upper portion 432U or the etch stop layer 433 may not include tensile stress to render the compressive force 436, 437 toward the sidewall of the cap structure 440. That is, one or more of the upper portion 432U or the etch stop layer 433 may include tensile stress to render compressive force toward the sidewall of the cap structure 440.

Figure 4E:
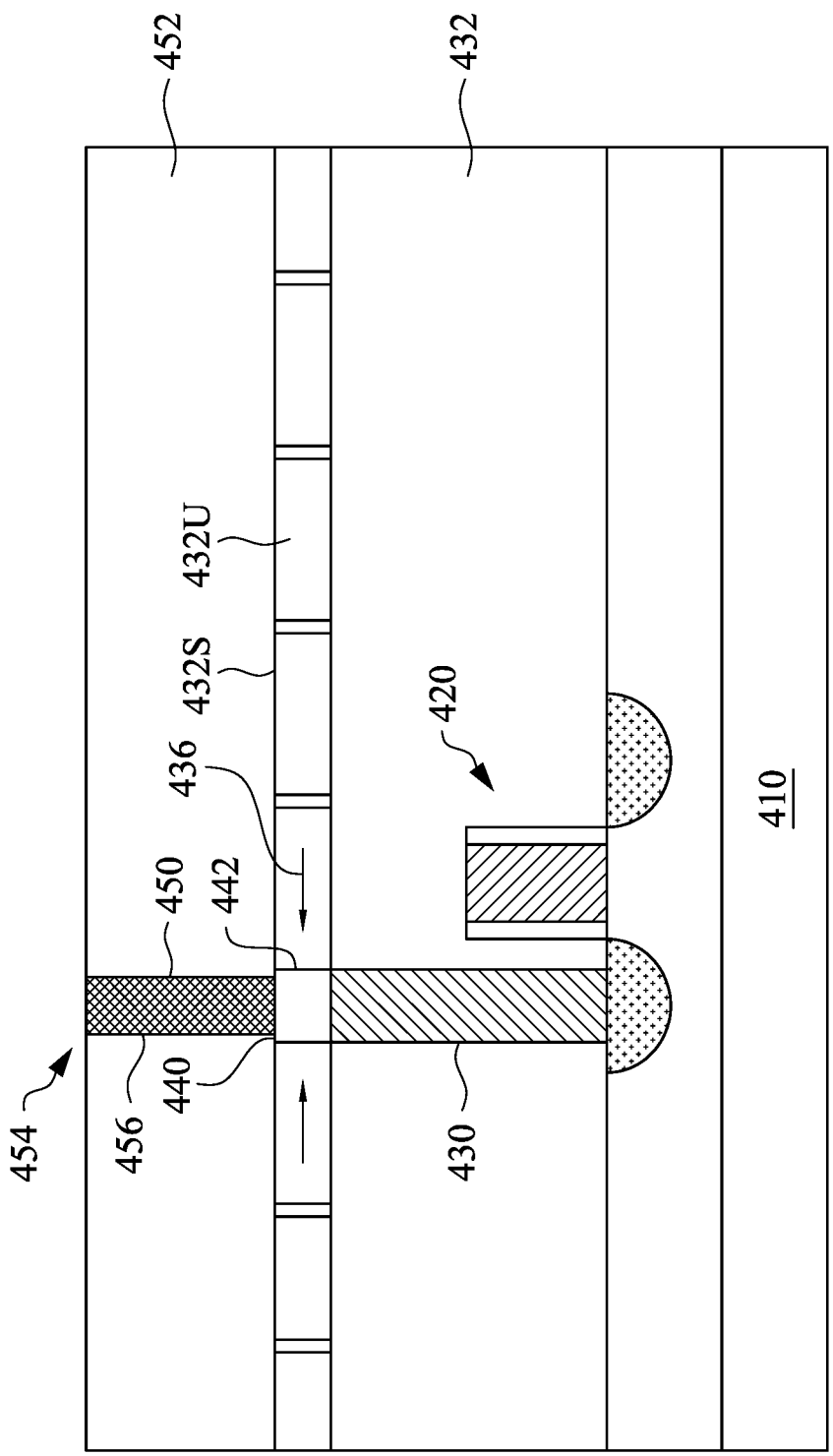

In example operation 350, with reference also to FIG. 4E, a second interconnect structure 450 is formed within a second dielectric layer 452 over the first dielectric layer 432 and contacting the cap structure 440. In an embodiment, the second interconnect structure 450 is formed via a damascene process. In the damascene process, the second dielectric layer 452 is formed over the first dielectric layer 432 and is patterned to form an aperture 454 exposing the cap structure 440. The second interconnect structure 450 is formed within the aperture 454, with excessive depositions removed through a CMP process 352. The deposition of the second interconnect structure 450 may be achieved using now known or future developed approaches, e.g., CVD, PVD, plating, or other suitable process.

In an example, the second interconnect structure 450 is formed of a same conductive material or a same type of conductive material as the cap structure 440. Two conductive materials are of a same type if they react similarly to the pH characteristic of a CMP slurry. In the case the cap structure is tungsten, the second interconnect structure is tungsten or aluminum, a conductive material that reacts to a CMP slurry similarly to tungsten.

For example, in the case that the second interconnect structure 450 is tungsten, a mild acidic, e.g., having pH value smaller than 4, CMP slurry is used to polish the second interconnect structure 450 in the CMP operation 352. The CMP slurry also includes oxidizers that oxidize the metal material of the second interconnect structure 450, e.g., tungsten. The oxidizer may include oxidizing metal salts such as ferric nitrate, cupric nitrate, zirconyl nitrate, oxidizing metal complexes, oxidizing acids such as ferric chloride, potassium permanganate, potassium ferricyanide, nitric acid, organic peroxides, inorganic peroxides, hydrogen peroxide, peracetic acid, nitric, persulfuric, peracetic and periodic acids, sulfates, potassium iodate and benzoyl peroxide and other suitable oxidizers. In an embodiment, the tungsten CMP slurry includes an iron-containing oxidizer, e.g., an iron salt such as ferric nitrate.

The CMP slurry also includes a plurality of abrasive particles. In an embodiment, the abrasive particles are one or more of carbon, diamond and carbides, nitrides, oxides or hydrated oxides of antimony, aluminum, boron, calcium, cerium, chromium, copper, gadolinium, germanium, hafnium, indium, iron, lanthanum, lead, magnesium, manganese, neodymium, nickel, scandium, silicon, terbium, tin, titanium, tungsten, vanadium, yttrium, zinc, and zirconium, and mixtures thereof, or other suitable abrasive particles. The plurality of abrasive particles may include chemically active metal oxides and chemically inactive oxides.

Optionally, the CMP slurry also includes a corrosion inhibitor. Corrosion inhibitors are helpful to reduce corrosion of cobalt, copper or tungsten or other metals exposed to the CMP slurry. Possible corrosion inhibitors include imidazoles, triazoles and benzotriazole.

Optionally, the CMP slurry also includes some surface active agent selected from one or more of sodium hexylsulfate, sodium heptyl sulfate, sodium octyl sulfate, sodium nonyl sulfate, and sodium lauryl sulfate, sodium alkyl sulfate, alkyl sulfonates, quaternary ammonium salts, and nonyl ethers.

The CMP slurry for polishing the excessive film of the interconnect structure 450 deposition may permeate through materials around an interface 456 between the second interconnect structure 450 and the second dielectric layer 452 or may pass through a gap in the interface 456. Because the second interconnect structure 450 and the cap structure 440 include the same or a same type of conductive materials, any CMP slurry used for polishing the second interconnect structure 450 that comes in contact with cap structure 440 does not damage the cap structure 440 in an uncontrolled manner. For example, the CMP slurry is normally selected to facilitate oxidizing the second interconnect structure 450 under a controlled surface conditions including surface pressure, surface temperature and oxygen supply. With the controlled surface conditions being removed, the remaining or residual portion of the second interconnect structure 450 or the cap structure 440 are relatively stable with respect to the CMP slurry. For example, the second interconnect structure 450 is stable with respect to the pH value, of the CMP slurry for the second interconnect structure 450, either acidic or alkaline. Further, the cap structure 440 prevents the CMP slurry used for planarizing the second interconnect structure 450 from reaching the first interconnect structure 430.

Figure 4F:
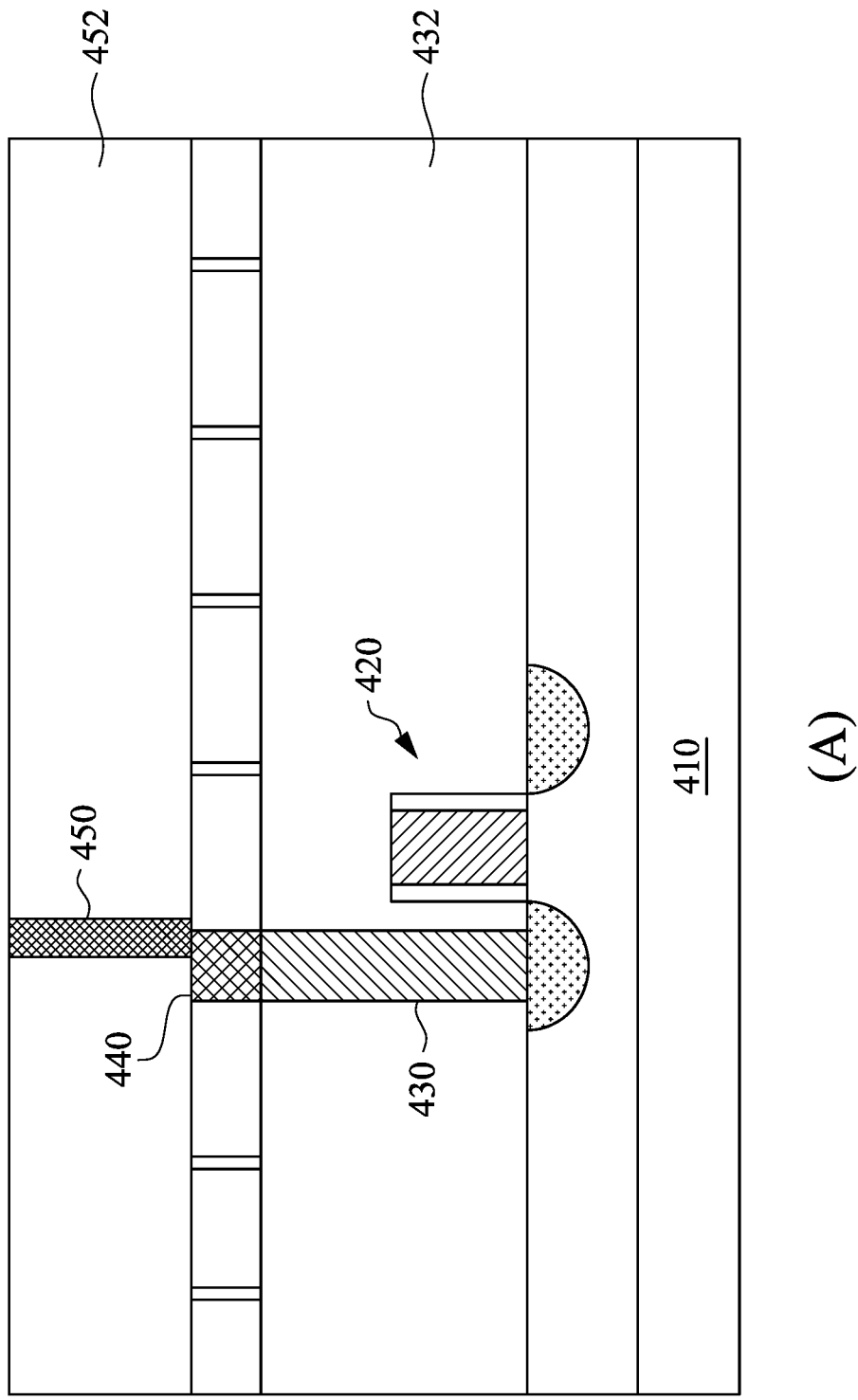
Figure 4F:
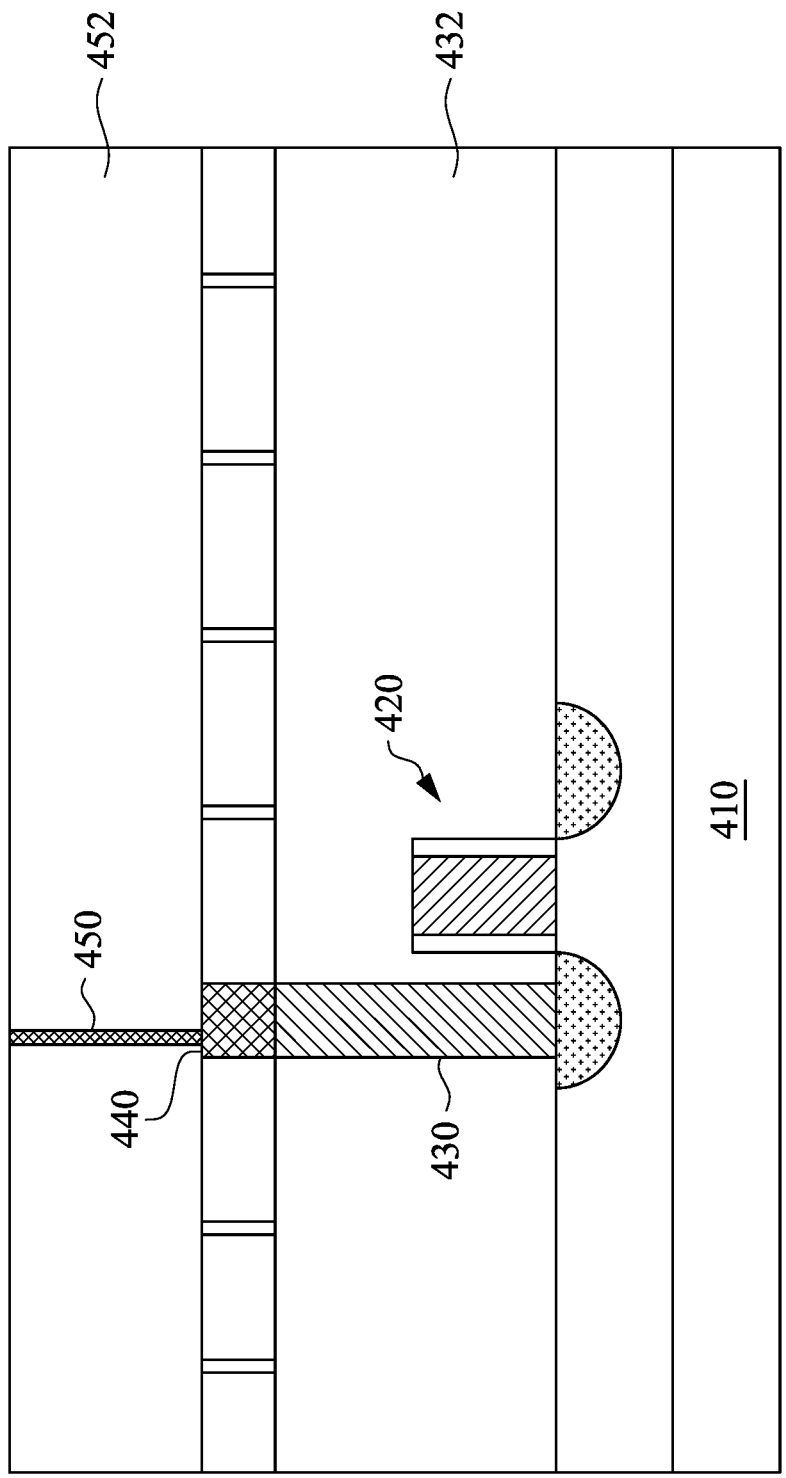
Figure 4F:
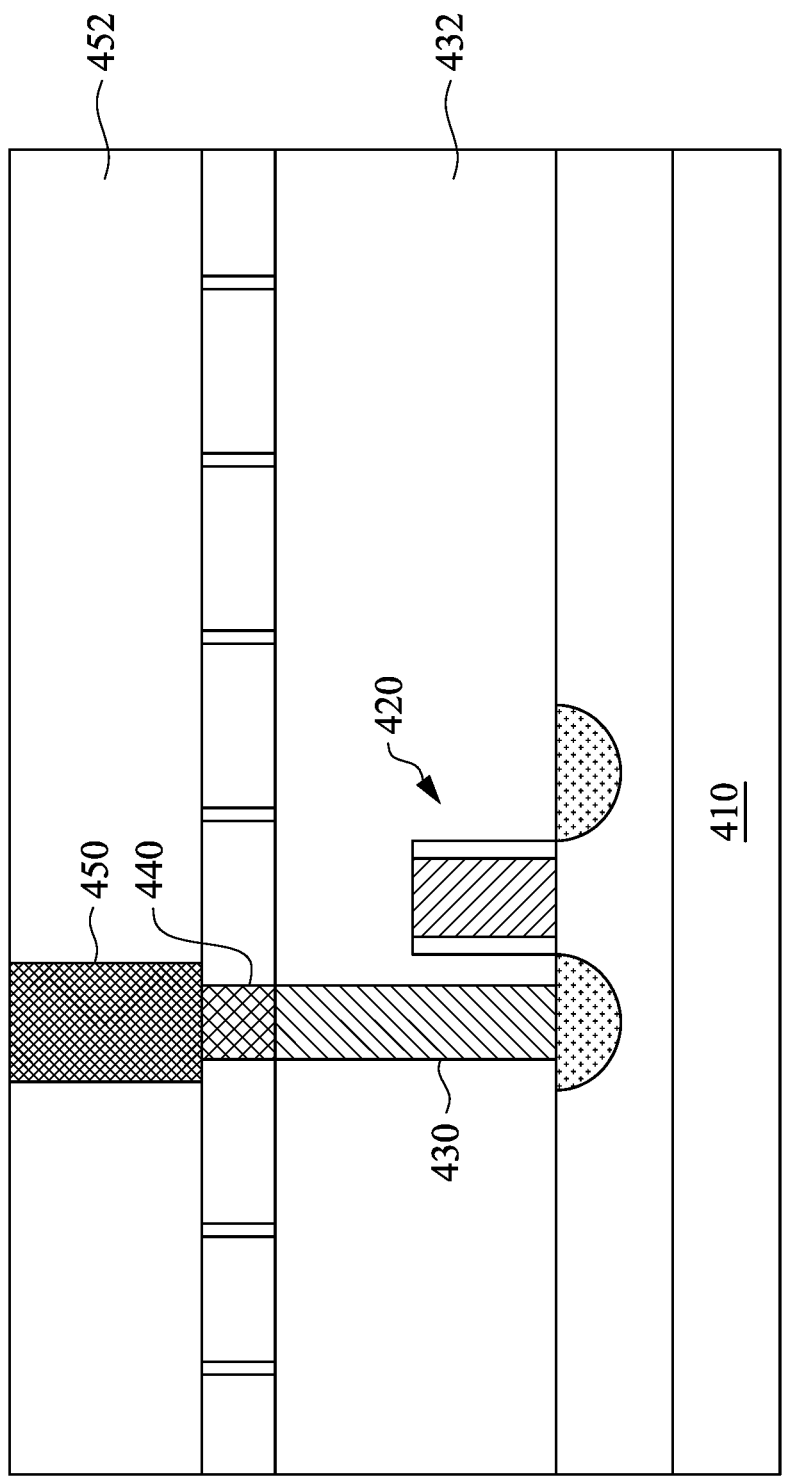

Not only does the modification of the upper portion 432U of dielectric layer 432 reduce or eliminate the gap in the interface 442 between the cap structure 440 and the upper portion 432 of the first dielectric layer 432, the cap structure 440 also improves the electrical connection between the first interconnect structure 430 and the second interconnect structure 450. FIG. 4F shows various example scenarios of the cap structure 440 improving the electrical connection between the first interconnect structure 430 and the second interconnect structure 450. Example A of FIG. 4F shows that the cap structure 440 helps in the scenario that the second interconnect structure 450 misaligns with the first interconnect structure 430. Example B of FIG. 4F shows that the cap structure 440 helps in the scenario that the second interconnect structure 450 includes a much smaller diameter than the first interconnect structure 430. Example C of FIG. 4F shows that the cap structure 440 helps in the scenario that the second interconnect structure 450 includes a much larger diameter than the first interconnect structure 430. In all the three example scenarios A, B, and C of FIG. 4F, without the cap structure 440, electrical connection failure may occur, especially when the upper surface of the first interconnect structure 430 includes an unintentionally formed recess 438, as shown in FIG. 4A.

Materials for the first dielectric layer 432, the second dielectric layer 452 or the additional dielectric layer 432A may include silicon oxide ($SiO_2$), silicon oxynitride, silicon nitride ($Si_3N_4$), silicon monoxide (SiO), silicon oxynitrocarbide (SiONC), silicon oxycarbide (SiOC), silicon mononitride (SiN), silicon oxynitrocarbide (SiONC), phosphosilicate glass (PSG), borophosphosilicate glass (BPSG), combinations thereof, or other suitable dielectric materials. The dielectric layers may be formed through chemical vapor deposition (CVD), high density plasma CVD, spin-on, sputtering, or other suitable approaches.

It should be emphasized that the above-described embodiments are merely possible examples of implementing the techniques, which are merely set forth for a clear understanding of the principles of the disclosure. Many variations and modifications can be made to the embodiments without substantially departing from the spirit and principles of the disclosure. The embodiments and the components thereof can also be combined in various ways which are also included in the disclosure.

Figure 4G:
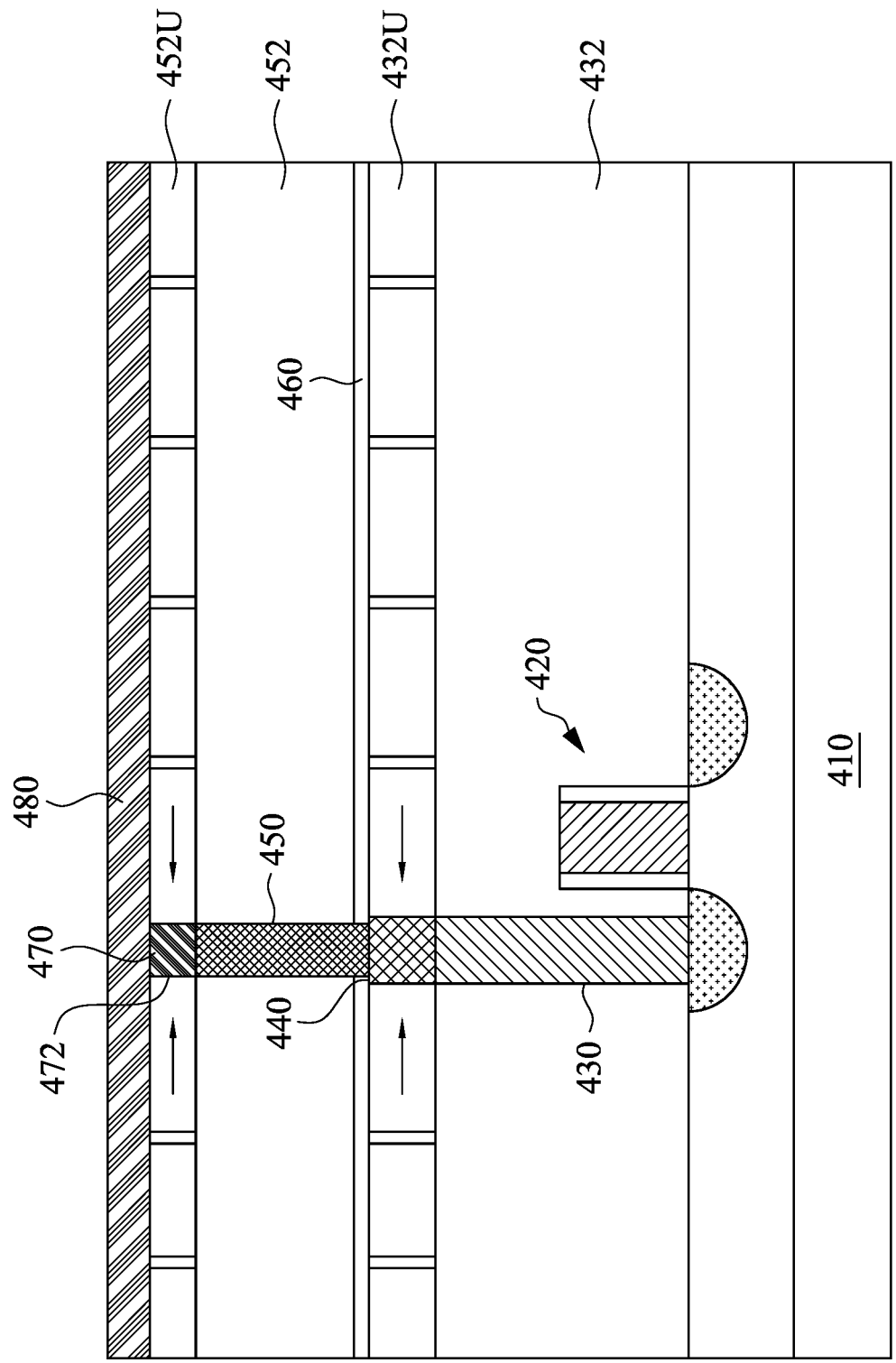

For example, as shown in FIG. 4G, an etch stop or CMP stop layer 460 is formed between the first dielectric layer 432 and the second dielectric layer 452. The etch stop layer 460 is formed from silicon nitride "SiN," silicon oxynitride "SiON," silicon carbide "SiC," silicon oxycarbide "SiOC," or other suitable dielectric materials or combinations thereof. The CMP stop layer 460 protects the underlying first dielectric layer 432 from being affected by the processes of forming the second interconnect structure 450.

In the embodiment illustrated in FIG. 4G, another cap structure 470 is formed over the second interconnect structure 450. A third interconnect structure 480, shown as a metal line, is formed over the cap structure 470 and connects to the second interconnect structure 450 through the cap structure 470. The cap structure 470 includes a conductive material different from that of the second interconnect structure 450. The third interconnect structure 480 includes a same or a same type of conductive material as the cap structure 470. An upper portion 452U of the second dielectric layer 452 is modified in accordance with embodiments described herein, e.g., by being doped, such that upper portion 452U expands to reduce the size of or close any gap at an interface 472 between the cap structure 470 and the second dielectric layer 452.

The present disclosure may be further appreciated with the description of the following embodiments:

A semiconductor structure embodiment includes a substrate, a semiconductor device over the substrate, a first interconnect structure within a first dielectric layer and connecting to a terminal of the semiconductor device, a first cap structure over the first interconnect structure and contacting the first interconnect structure, and a second interconnect structure over the cap structure and contacting the cap structure. The first cap structure is positioned at least partially within the first dielectric layer.

Another embodiment is directed to a semiconductor structure. The semiconductor structure includes a substrate and an conductive via structure within a dielectric layer over the substrate. An upper surface of the conductive via structure is lower than an upper surface of the dielectric layer adjacent to the conductive via structure. The semiconductor structure also includes a conductive cap structure directly over the conductive via structure. An upper surface of the conductive cap structure is one of substantially at a same level with or higher than the upper surface of the dielectric layer adjacent to the conductive via structure.

A further embodiment is directed to a method. In the method, a first metal structure is formed within a first dielectric layer. An upper surface of the first metal structure is lower than an upper surface of the first dielectric layer that is adjacent to the upper surface of the first metal structure. A second metal structure is formed over the upper surface of the first metal structure. An upper portion of the first dielectric layer is strained to have a tensile stress.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor structure, comprising:
a substrate;
a semiconductor device over the substrate;
a first interconnect structure within a first dielectric layer and connecting to a terminal of the semiconductor device;
a first cap structure over the first interconnect structure and contacting the first interconnect structure, the first cap structure at least partially within the first dielectric layer and adjacent to an upper portion of the first dielectric layer, the upper portion of the first dielectric layer including an ion implantation different from a lower portion of the first dielectric layer that is closer to the substrate than the upper portion of the first dielectric layer; and
a second interconnect structure over the first cap structure and contacting the first cap structure.

2. The semiconductor structure of claim 1, wherein the upper portion of the first dielectric layer includes a tensile stress against an interface between the first dielectric layer and the first cap structure.

3. The semiconductor structure of claim 1, wherein the first cap structure is at least partially within the upper portion of the first dielectric layer.

4. The semiconductor structure of claim 1, wherein the ion implantation in the upper portion of the first dielectric layer includes one or more of germanium, silicon, carbon, nitrogen, phosphorus or boron.

5. The semiconductor structure of claim 1, wherein the first cap structure includes a same conductive material as the second interconnect structure.

6. The semiconductor structure of claim 1, wherein the first cap structure includes a different conductive material from the first interconnect structure.

7. The semiconductor structure of claim 6, wherein a conductive material of the first cap structure is different from a conductive material of the first interconnect structure in reacting to at least one of an acidic solution or an alkaline solution.

8. The semiconductor structure of claim 6, wherein one of the first cap structure or the first interconnect structure is tungsten and another one of the first cap structure or the first interconnect structure is one or more of cobalt or copper.

9. The semiconductor structure of claim 1, wherein the first cap structure extends laterally beyond the second interconnect structure at least in one direction.

10. The semiconductor structure of claim 1, wherein the first cap structure includes a different diameter than the second interconnect structure.

11. The semiconductor structure of claim 1, wherein the first cap structure misaligns with the second interconnect structure.

12. The semiconductor structure of claim 1, further comprising a second cap structure directly over the second interconnect structure and a third interconnect structure directly over the second cap structure.

13. A semiconductor structure, comprising:
a substrate;
a dielectric layer over the substrate, the dielectric layer including an upper portion and a lower portion that is closer to the substrate than the upper portion, the upper portion including an ion implantation different from the lower portion and having a tensile stress due to the ion implantation;
an conductive via structure within the dielectric layer, an upper surface of the conductive via structure being lower than an upper surface of the dielectric layer adjacent to the conductive via structure; and
a conductive cap structure directly over the conductive via structure, an upper surface of the conductive cap structure being one of substantially at a same level with or higher than the upper surface of the dielectric layer adjacent to the conductive via structure.

14. The semiconductor structure of claim 13, wherein the conductive cap structure extends laterally beyond the conductive via structure at least in one direction.

15. The semiconductor structure of claim 13, wherein the conductive cap structure misaligns with the conductive via structure.

16. A structure, comprising:
a substrate;
a first dielectric layer over the substrate, the dielectric layer including an upper portion and a lower portion that is closer to the substrate than the upper portion, the upper portion including an ion implantation different from the lower portion;
a first metal structure within the first dielectric layer, an upper surface of the first metal structure being lower than an upper surface of the first dielectric layer that is adjacent to the upper surface of the first metal structure; and
a second metal structure over the upper surface of the first metal structure, the second metal structure adjacent to the upper portion of the first dielectric layer;
wherein the upper portion of the first dielectric layer includes a tensile stress against an interface between the first dielectric layer and the second metal structure.

17. The structure of claim 16, wherein the upper portion of the first dielectric layer includes implanted ions of one or more of germanium, silicon, carbon, nitrogen, phosphorus or boron.

18. The structure of claim 16, further comprising:
a third metal structure directly over the second metal structure; and
a second dielectric layer over the first dielectric layer and surrounding the third metal structure.

19. The structure of claim 16, wherein the second metal structure includes a different conductive material from the first metal structure.

20. The structure of claim 19, wherein a conductive material of the second metal structure is different from a conductive material of the first metal structure in reacting to at least one of an acidic solution or an alkaline solution.

* * * * *